US008546786B2

(12) United States Patent
Yoshimizu et al.

(10) Patent No.: US 8,546,786 B2
(45) Date of Patent: Oct. 1, 2013

(54) STACKED MULTIPLE CELL NONVOLATILE MEMORY DEVICE

(75) Inventors: Yasuhito Yoshimizu, Kanagawa-ken (JP); Fumiki Aiso, Kanagawa-ken (JP); Atsushi Fukumoto, Kanagawa-ken (JP); Takashi Nakao, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/344,680

(22) Filed: Jan. 6, 2012

(65) Prior Publication Data

US 2012/0104340 A1    May 3, 2012

Related U.S. Application Data

(62) Division of application No. 12/554,581, filed on Sep. 4, 2009, now Pat. No. 8,115,245.

(30) Foreign Application Priority Data

Sep. 26, 2008    (JP) ................................ 2008-247549

(51) Int. Cl.
*H01L 45/00*    (2006.01)
*H01L 29/06*    (2006.01)

(52) U.S. Cl.
USPC ......... 257/5; 257/314; 257/E45.002; 365/175

(58) Field of Classification Search
CPC .. H01L 29/861; H01L 29/868; H01L 27/2409
USPC ............... 257/2, 3, 4, E45.002, 5; 365/148, 365/175
See application file for complete search history.

(56) References Cited

U.S. PATENT DOCUMENTS

| 5,373,166 A * | 12/1994 | Buchan et al. ................. 257/18 |
| 6,426,285 B1 | 7/2002 | Chen et al. |
| 7,826,249 B2 * | 11/2010 | Toda ............................. 365/148 |

(Continued)

FOREIGN PATENT DOCUMENTS

JP    2005-026404    1/2005

OTHER PUBLICATIONS

Stanley Wolf, Silicon Processing for the VLSI ERA, 2000, Lattice Press, vol. 1, pp. 109-112.*

*Primary Examiner* — Jerome Jackson, Jr.
*Assistant Examiner* — Paul Budd
(74) *Attorney, Agent, or Firm* — Finnegan, Henderson, Farabow, Garrett & Dunner, L.L.P.

(57) ABSTRACT

A nonvolatile memory device includes: a substrate; a stacked structure member including a plurality of dielectric films and a plurality of electrode films alternately stacked on the substrate and including a through-hole penetrating through the plurality of the dielectric films and the plurality of the electrode films in a stacking direction of the plurality of the dielectric films and the plurality of the electrode films; a semiconductor pillar provided in the through-hole; and a charge storage layer provided between the semiconductor pillar and each of the plurality of the electrode films. At least one of the dielectric films includes a film generating one of a compressive stress and a tensile stress, and at least one of the electrode films includes a film generating the other of the compressive stress and the tensile stress.

5 Claims, 14 Drawing Sheets

(56) References Cited

U.S. PATENT DOCUMENTS

| | | |
|---|---|---|
| 2006/0202209 A1 | 9/2006 | Kelman et al. |
| 2007/0123024 A1 | 5/2007 | Pallinti et al. |
| 2007/0158736 A1 | 7/2007 | Arai et al. |
| 2008/0050886 A1 | 2/2008 | Hirota et al. |
| 2008/0081465 A1 | 4/2008 | Kim et al. |
| 2009/0166600 A1* | 7/2009 | Park et al. .................. 257/3 |

* cited by examiner

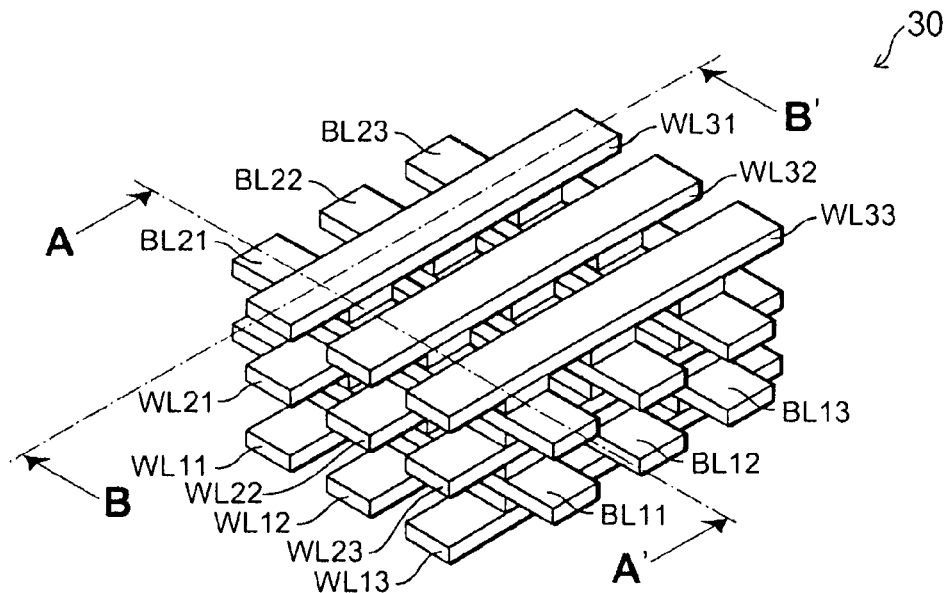
FIG. 14A
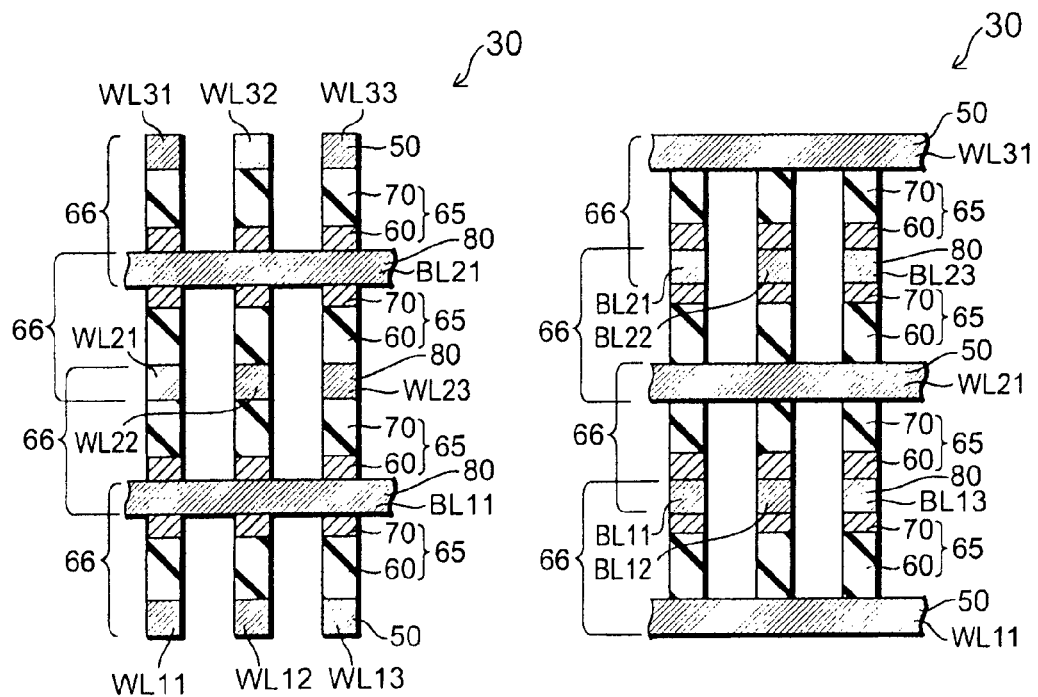
FIG. 14B
FIG. 14C

STACKED MULTIPLE CELL NONVOLATILE MEMORY DEVICE

CROSS-REFERENCE TO RELATED APPLICATIONS

This is a division of application Ser. No. 12/554,581, filed Sep. 4, 2009, now U.S. Pat. No. 8,115,245 which is incorporated herein by reference.

This application is based upon and claims the benefit of priority from the prior Japanese Patent Application No. 2008-247549, filed on Sep. 26, 2008; the entire contents of which are incorporated herein by reference.

BACKGROUND OF THE INVENTION

1. Field of the Invention

The present invention relates to a nonvolatile memory device and a method for manufacturing the same.

2. Background Art

A technique of stacking multiple cells is now being developed in order to achieve high-density flash memories. The technique includes the following, for example. Dielectric films and electrode films are alternately stacked on a substrate, and then through-holes are formed simultaneously. Then, a charge storage layer retaining charges is formed on the side face of the through-holes, after which columnar electrodes are buried in the through-holes. Thereby, memory cells are arranged three-dimensionally at intersections of the columnar electrodes and the electrode films. Then, a plurality of selecting gate lines extending in one direction are provided on the uppermost electrode film. Then, a plurality of bit lines extending in another direction are provided thereabove and connected to the upper ends of the columnar electrodes. Thereby, an arbitrary columnar electrode can be selected. On the other hand, the electrode films are connected to word lines different from each other and thereby an arbitrary electrode film can be selected. Consequently, an arbitrary memory cell can be selected, and writing and reading of data can be performed.

On the other hand, nonvolatile memory devices using variable resistance stats of resistance materials such as a phase-change memory and resistance-change memory are expected as a nonvolatile memory device of high density and high reliability. In this case also, a large number of phase-change memory units and resistance-change memory units are stacked on a substrate to obtain a high memory density.

Thus, in phase-change memories, resistance-change memories, and nonvolatile memory devices of charge storage type in which multiple cells are stacked, a large number of films are stacked on the substrate and this leads to an increase of distortions of the substrate and a large warpage of the substrate because films which generate a compressive stress or a tensile stress are formed only on one surface of a substrate. For example, when a stacked film of a polycrystalline silicon film and a TEOS (tetraethyl orthosilicate) film is stacked 32 times, the warpage of the substrate becomes 200 μm or more in the convex direction. Such a large warpage deteriorates manufacturing process accuracy, prevents stable operation of manufacturing equipment, and causes a broken wafer, which leads to a big problem.

JP-A 2005-26404 (Kokai) discloses a technique of reducing the warpage of a wafer.

SUMMARY OF THE INVENTION

According to an aspect of the invention, there is provided a nonvolatile memory device including: a substrate; a stacked structure member including a plurality of dielectric films and a plurality of electrode films alternately stacked on the substrate and including a through-hole penetrating through the plurality of the dielectric films and the plurality of the electrode films in a stacking direction of the plurality of the dielectric films and the plurality of the electrode films; a semiconductor pillar provided in the through-hole; and a charge storage layer provided between the semiconductor pillar and each of the plurality of the electrode films, at least one of the dielectric films including a film generating one of a compressive stress and a tensile stress, and at least one of the electrode films including a film generating the other of the compressive stress and the tensile stress.

According to another aspect of the invention, there is provided a nonvolatile memory device including a plurality of element memory layers stacked on each other, each of the plurality of the element memory layers including: a first wiring; a second wiring provided nonparallel to the first wiring; and a stacked structure body provided between the first wiring and the second wiring and including a memory unit and a rectifying element, and the rectifying element including: a first rectifying element film generating one of a compressive stress and a tensile stress; and a second rectifying element film generating the other of the compressive stress and the tensile stress.

According to another aspect of the invention, there is provided a method for manufacturing a nonvolatile semiconductor memory device including: forming a plurality of first films and a plurality of second films on a substrate stacking alternately, at least one of the plurality of the first films generating one of a compressive stress and a tensile stress, at least one of the plurality of the second films generating the other of the compressive stress and the tensile stress, and each of the second films being conductive; and forming a memory unit opposing to at least one of the plurality of the second films.

BRIEF DESCRIPTION OF THE DRAWINGS

FIGS. 14A to 14C are schematic views illustrating a configuration of a nonvolatile memory device according to a third embodiment of the present invention;

DETAILED DESCRIPTION OF THE INVENTION

Embodiments of the present invention will now be described with reference to the drawings.

The drawings are schematic or conceptual; and the relationships between the thickness and width of portions, the proportions of sizes among portions, and the like are not necessarily the same as the actual values thereof. Further, the dimensions and proportions may be illustrated differently among drawings, even for identical portions.

In the specification of the present application and drawings, components similar to those described in regard to a drawing thereinabove are marked with the same reference signs, and a detailed description is omitted as appropriate.

First Embodiment

A nonvolatile memory device according to a first embodiment of the present invention is an example of a nonvolatile memory device in which dielectric films and electrode films are alternately stacked, through-holes are simultaneously formed, and a charge storage layer is formed on the side face of the through-holes.

Figure 1:
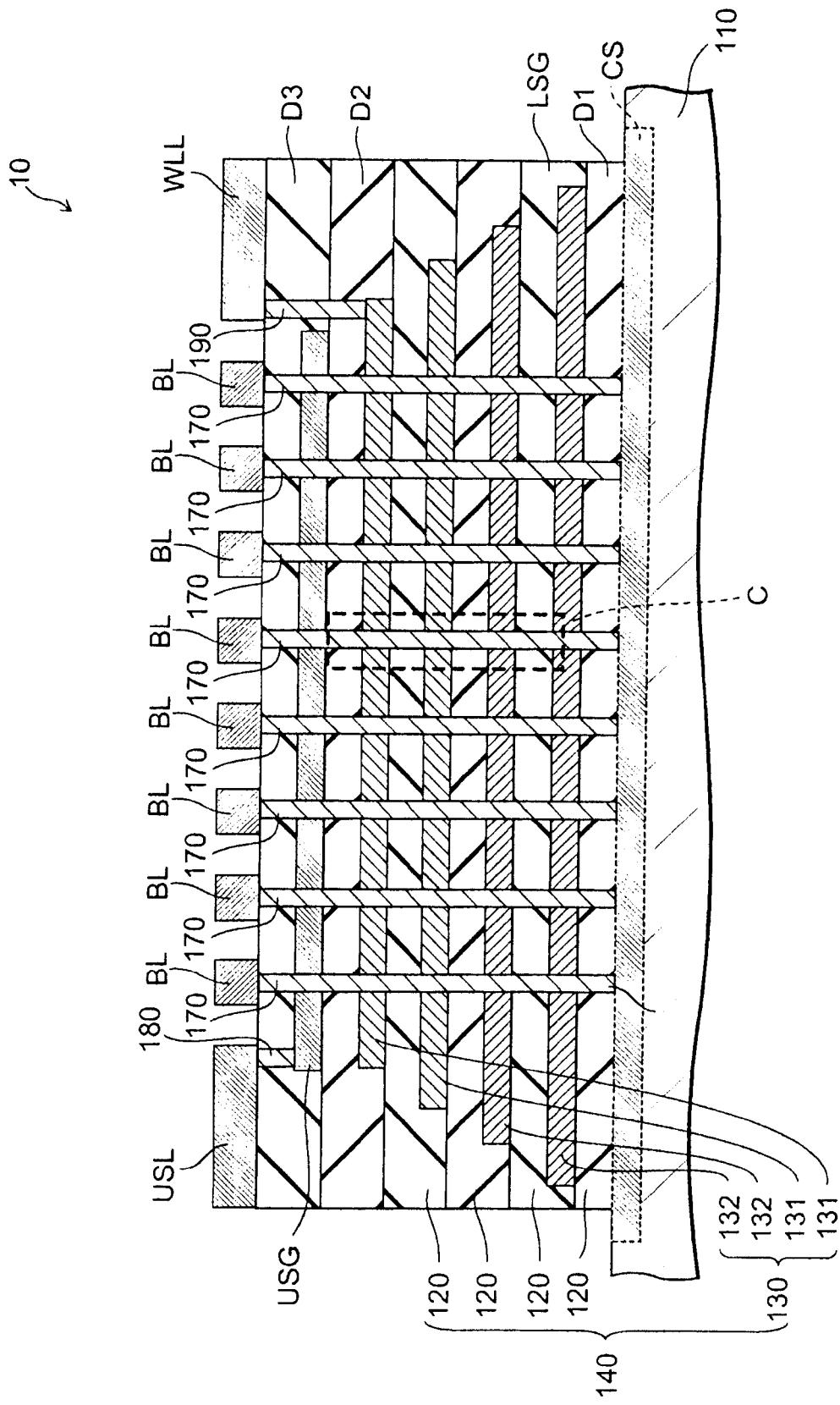
FIG. 1 is a schematic cross-sectional view illustrating a configuration of a nonvolatile memory device according to a first embodiment of the present invention.

FIG. 1 is a schematic cross-sectional view illustrating a configuration of a nonvolatile memory device according to the first embodiment of the present invention.

Figure 2:
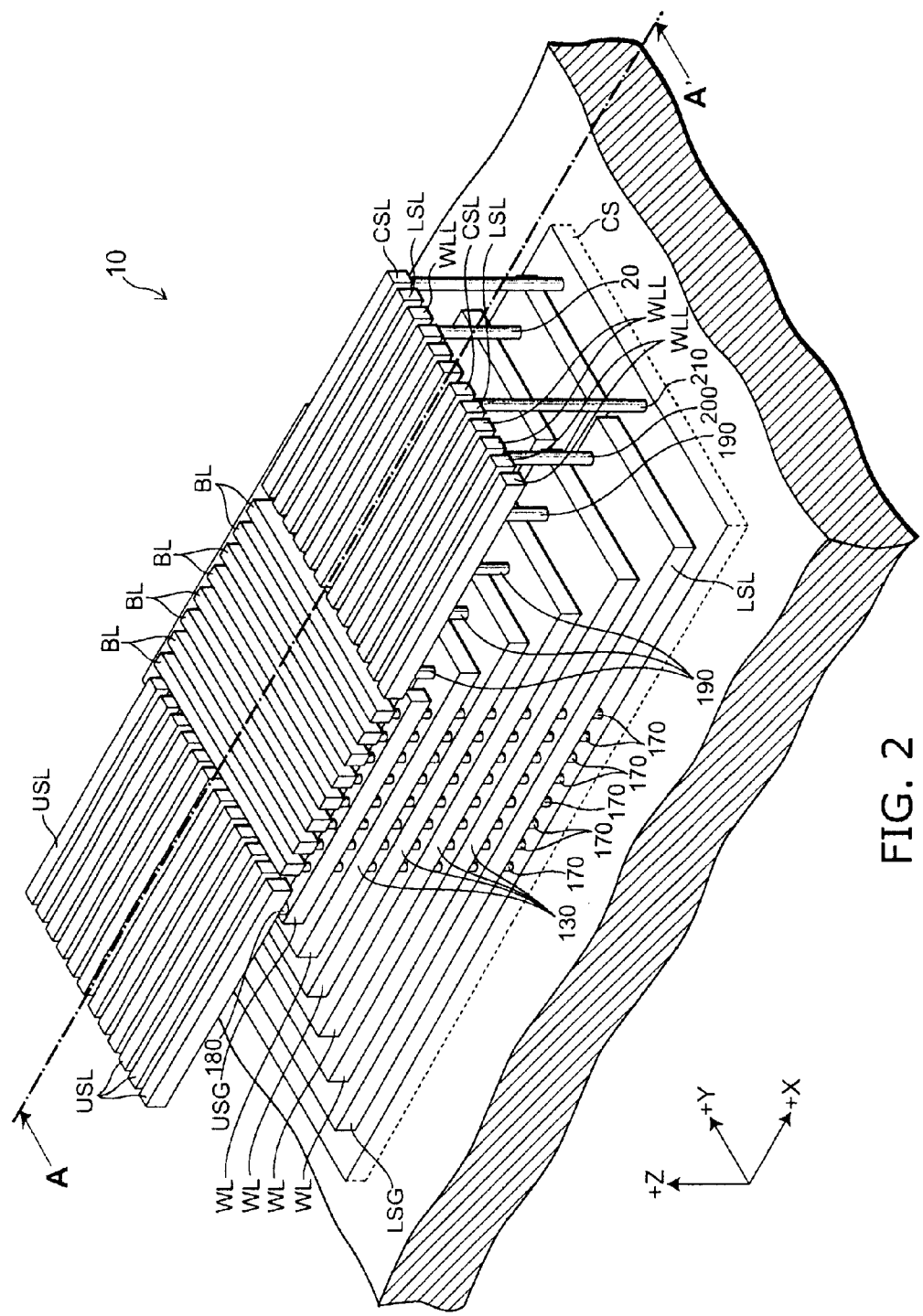
FIG. 2 is a schematic perspective view illustrating the configuration of the nonvolatile memory device according to the first embodiment of the present invention.

FIG. 2 is a schematic perspective view illustrating the configuration of the nonvolatile memory device according to the first embodiment of the present invention.

Figure 3:
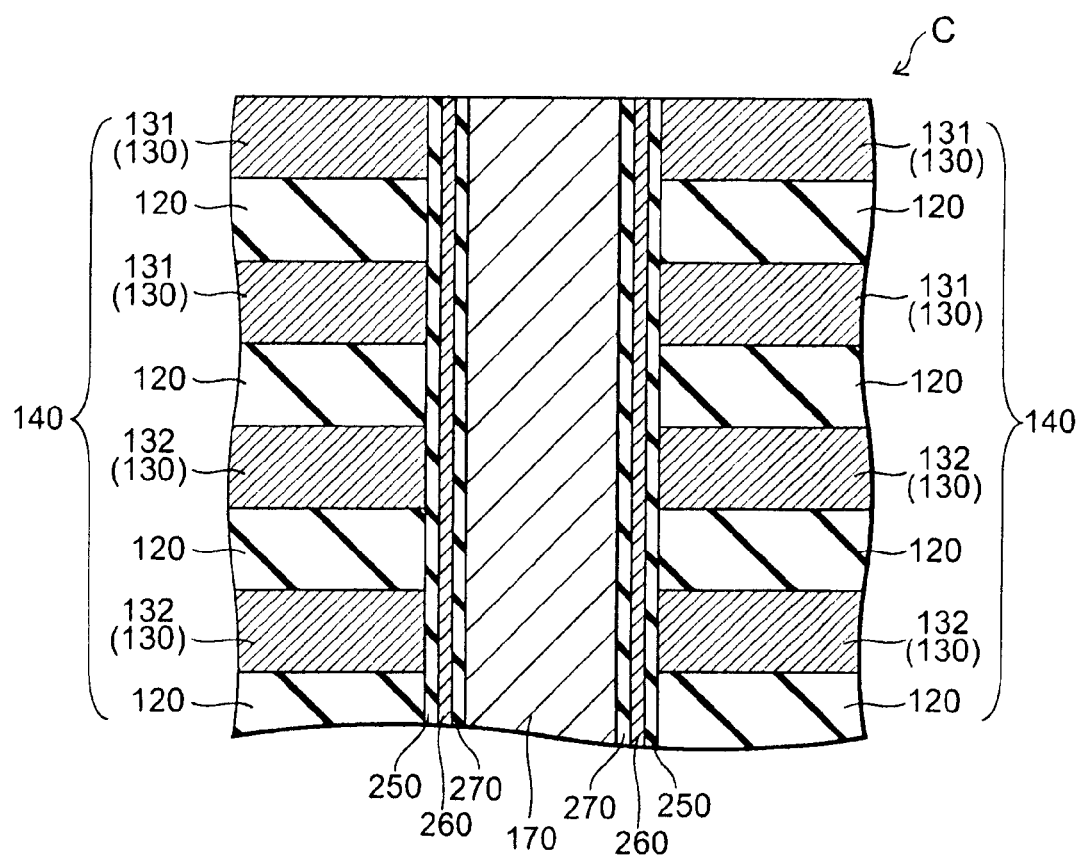
FIG. 3 is a schematic cross-sectional view illustrating a configuration of a portion of the nonvolatile memory device according to the first embodiment of the present invention.

FIG. 3 is a schematic cross-sectional view illustrating a configuration of a portion of the nonvolatile memory device according to the first embodiment of the present invention.

That is, FIG. 1 is a cross-sectional view taken along line A-A' shown in FIG. 2. FIG. 3 is a schematic enlarged cross-sectional view of the C portion shown in FIG. 1.

FIG. 2 illustrates only conductive portions to facilitate visualization and omits insulation portions. Further, FIG. 1 to FIG. 3 illustrate fewer stacked layers than the actual device.

As shown in FIG. 1 and FIG. 2, a nonvolatile memory device 10 according to the first embodiment of the present invention includes a substrate 110 made of, for example, single-crystal silicon. Impurities are added to a rectangle region in the upper portion of the substrate 110 to form a semiconductor region, which forms a cell source CS. A dielectric layer D1 made of, for example, silicon oxide ($SiO_2$) is provided directly on the cell source CS on the substrate 110, and a lower selecting gate LSG made of polycrystalline silicon is provided thereon.

A stacked body 140 in which a plurality of dielectric films 120 and a plurality of electrode films 130 are alternately stacked is formed above the lower selecting gate LSG. The electrode films 130 serve as word lines WL, and the dielectric films 120 serve as interlayer dielectric films which insulate word lines WL from each other.

Although FIG. 1 to FIG. 3 illustrate four electrode films 130, the number of the electrode films 130 is twenty in this specific example.

In the nonvolatile memory device 10 according to this embodiment, the electrode films 130 includes, for example, a first electrode film 131 and a second electrode film 132. Specifically, the electrode films 130 of the 1st to 12th layers are second electrode films 132, and the electrode films 130 of the 13th to 20th layers are first electrode films 131. The second electrode films 132 are based on polycrystalline silicon (p-Si) which generates a compressive stress, and the first electrodes film 131 are based on amorphous silicon (a-Si) which generates a tensile stress.

Dielectric films 120 are provided in accordance with the total number of electrode films 130. In the nonvolatile memory device 10 according to this embodiment, the dielectric film 120 may be based on, for example, TEOS (tetraethyl orthosilicate) film which generates a compressive stress.

For convenience of description in the following of this specification, an XYZ orthogonal coordinate system is used. In this coordinate system, two directions parallel to the upper surface of the substrate 110 and orthogonal to each other are defined as an X direction and a Y direction, and the direction orthogonal to both the X direction and Y direction, that is, the stacking direction of dielectric films 120 and electrode films 130 is defined as a Z direction.

The length of electrode films 130 in the X direction becomes shorter toward the upside. As viewed from above (+Z direction), each electrode film 130 is located inner side of the electrode films 130 disposed therebelow, the lower selecting gate LSG, and the cell source CS. Dielectric layers (not illustrated) are provided in the region on the ±X-direction and ±Y-direction sides with respect to the electrode film 130. A plurality of stacked bodies 140 are provided along the Y direction.

A dielectric layer D2 is provided on the stacked body 140; upper selecting gates USG based on, for example, polycrystalline silicon are provided thereon; and a dielectric layer D3 is provided thereon. The upper selecting gates USG are formed by dividing one conductive film based on, for example, polycrystalline silicon along the Y direction and form a plurality of conductive members, each shaped like a wiring extending in the X direction. The word lines WL and the lower selecting gate LSG are formed for each stacked body 140, each formed into one plate-like conductive member parallel to the XY plane. Further, the cell source CS also is not divided but formed into one plate-like conductive member parallel to the XY plane so as to connect the directly-underlying regions of the plurality of stacked bodies 140.

A plurality of semiconductor pillars 170 extending in the stacking direction (Z direction) are buried in each dielectric film 120 and each electrode film 130 included in the stacked body 140. Each semiconductor pillar 170 penetrates entirely through the stacked body 140, and has a diameter of, for example, 90 nm. The semiconductor pillars 170 are arranged in a matrix configuration along the X and Y directions, for example. The arrangement period of the semiconductor pillar 170 is constant in both the X and Y directions, for example.

The semiconductor pillars 170 are based on an impurity-doped semiconductor such as polycrystalline silicon or amorphous silicon.

As shown in FIG. 3, a first dielectric layer 250, a charge storage layer 260 (a memory unit), and a second dielectric layer 270 are stacked in this order from outside, that is, the dielectric film 120 and the electrode film 130 side, in the cylindrical space between the semiconductor pillar 170, and the dielectric films 120 and the electrode films 130. The first dielectric layer 250 and the second dielectric layer 270 may be based on, for example, silicon oxide ($SiO_2$), and the charge storage layer 260 may be based on, for example, silicon nitride (SiN).

The semiconductor pillar 170 serves as a source region, channel region, and drain region; the word line WL serves as a control gate; and the charge storage layer 260 serves as a memory layer. Thereby, a NAND-type flash memory is formed to serve as a memory cell. Consequently, as many memory cells as the word lines WL are arranged in a line in the Z direction in one semiconductor pillar 170 and therearound to constitute one memory string. Further, in the nonvolatile memory device 10, the plurality of semiconductor pillars 170 are arranged in a matrix configuration along the X and Y directions. Therefore, a plurality of memory cells are arranged in a three-dimensional lattice configuration along the X, Y, and Z directions.

A not-illustrated lower columnar electrode is provided directly below the semiconductor pillar 170 so as to penetrate through the dielectric layer D1 and the lower selecting gate LSG. The lower end of the lower columnar electrode is connected to the cell source CS and the upper end thereof is connected to the semiconductor pillar 170. A not-illustrated gate dielectric film is provided between the lower columnar electrode, and the dielectric layer D1 and the lower selecting gate LSG.

On the other hand, a not-illustrated upper columnar electrode is provided directly above the semiconductor pillar 170 so as to penetrate through the dielectric layer D2, the upper selecting gate USG, and the dielectric layer D3. The lower end of the upper columnar electrode is connected to the semiconductor pillar 170. A not-illustrated gate dielectric film is provided between the upper columnar electrode, and the dielectric layer D2, the upper selecting gate USG and the dielectric layer D3.

The lower columnar electrode and the upper columnar electrode may be based on an impurity-doped semiconductor such as polycrystalline silicon or amorphous silicon.

Each lower columnar electrode, each corresponding semiconductor pillar 170, and each corresponding upper columnar electrode are connected to each other integrally to form one columnar semiconductor member. As described above, the upper columnar electrode penetrates through the upper selecting gate USG; the semiconductor pillar 170 penetrates through the plurality of word lines WL; and the lower columnar electrode penetrates through the lower selecting gate LSG.

A plurality of bit lines BL (bit wirings) extending in the Y direction are provided on the dielectric layer D3 directly above the region where the upper selecting gates USG are arranged. The bit lines BL may be based on a metal such as tungsten (W), aluminum (Al), copper (Cu), and the like. The term "metal" used in this specification includes alloys as well as pure metals.

The bit lines BL are provided directly above the semiconductor pillars 170, and each bit line BL is connected to the upper ends of each column of upper columnar electrodes arranged along the Y direction. Thereby, semiconductor pillars 170 of different columns extending in the Y direction are connected to different bit lines BL. The bit lines BL are arranged continuously so as to pass directly above a plurality of stacked bodies 140 arranged in the Y direction, and each bit line BL is commonly connected to the semiconductor pillars 170 of each stacked body 140.

Further, a plurality of upper selecting gate lines USL extending in the X direction are provided on the −X-direction side of the region including the bit lines BL. The upper selecting gate line USL may be based on a metal such as tungsten, aluminum, copper, and the like. The number of upper selecting gate lines USL is equal to the number of upper selecting gates USG, and each upper selecting gate line USL is connected to each corresponding upper selecting gate USG through each corresponding via 180.

Furthermore, for one stacked body 140, a plurality of word wirings WLL extending in the X direction, one lower selecting gate line LSL extending in the X direction, and one cell source line CSL extending in the X direction are provided on the +X-direction side of the region including the bit lines BL. The word wiring WLL, the lower selecting gate line LSL, and the cell source line CSL may be based on a metal such as tungsten, aluminum, and copper.

The number of word wirings WLL for one stacked body 140 is equal to the number of word lines WL, and each word wiring WLL is connected to each corresponding word line WL through a via 190. The lower selecting gate line LSL is connected to the lower selecting gate LSG through a via 200, and the cell source line CSL is connected to the cell source CS through a contact 210. The vias 190 and 200 and the contact 210 are formed in a region that lies directly above the electrode film 130 to which they are connected and out of the overlying electrode film 130 on the +X-direction side.

The bit lines BL, the upper selecting gate lines USL, the word wirings WLL, the lower selecting gate lines LSL, and the cell source lines CSL are respectively identical, for example, in a position in the height direction (Z direction), thickness and material, and may be formed by, for example, patterning one metal film respectively. The lines and wirings are insulated from each other by an interlayer dielectric film (not illustrated).

The nonvolatile memory device 10 includes: a driver circuit that applies a potential to the upper end of the upper columnar electrode via the bit line BL; a driver circuit that applies a potential to the lower end of the lower columnar electrode via the cell source line CSL, the contact 210, and the cell source CS; a driver circuit that applies a potential to the upper selecting gate USG via the upper selecting gate line USL and the via 180; a driver circuit that applies a potential to the lower selecting gate LSG via the lower selecting gate line LSL and the via 200; and a driver circuit that applies a potential to each word line WL via the word wiring WLL and the via 190 (all not illustrated).

The nonvolatile memory device 10 according to this embodiment is, as described previously, a nonvolatile memory device including the charge storage layer 260 as a memory layer; and the plurality of electrode films 130, each of which corresponds to each memory cell, are stacked above the substrate 110 via the dielectric films 120. In this specific example, polycrystalline silicon, i.e., p-Si, which generates a compressive stress is used for the second electrode films 132, i.e., the electrode films 130 of the 1st to 12th layers, a-Si which generates a tensile stress is used for the first electrode films 131, i.e., the electrode films 130 of the 13th to 20th layers, and TEOS which generates a compressive stress is used for the dielectric films 120. Therefore, even if a large number of electrode films 130 and dielectric films 120 are stacked, the stress of the electrode film 130 and that of the dielectric film 120 are cancelled and a large warpage of the substrate 110 can be avoided.

Figure 4:
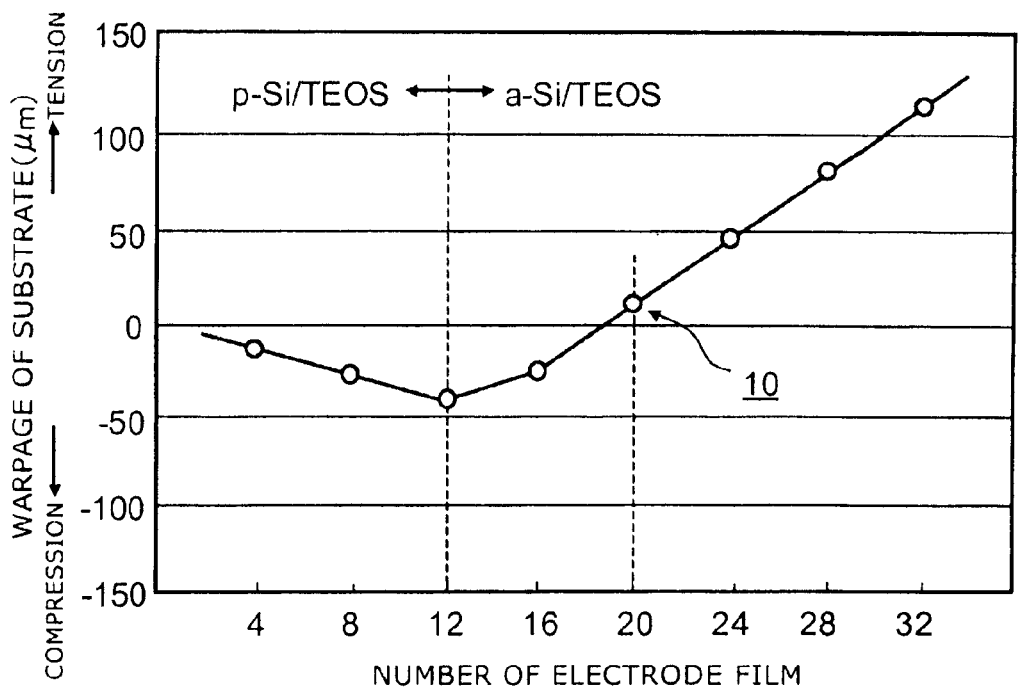
FIG. 4 is a graph chart illustrating the characteristics of the nonvolatile memory device according to the first embodiment of the present invention.

FIG. 4 is a graph chart illustrating the characteristics of the nonvolatile memory device according to the first embodiment of the present invention.

More specifically, the figure illustrates the results of an experiment on change in substrate warpage when p-Si films (second electrode films 132) and TEOS films (dielectric films 120) are alternately stacked on a semiconductor substrate and then a-Si films (first electrode films 131) and TEOS films (dielectric films 120) are alternately stacked. The horizontal axis represents the number of electrode films, and the vertical axis represents the amount of substrate warpage. In this experiment, a semiconductor wafer with a diameter of 300 mm and a thickness of 750 µm is used as the substrate, p-Si films and TEOS films are alternately stacked twelve times thereon to be formed into a film, and then a-Si films and TEOS films are alternately stacked as many times as corresponding to the 13th to 32nd layers in the aggregate to be formed into a film.

Thus, the dielectric film 120 is a silicon oxide film. The electrode films in a first stacking region are p-Si, and the electrode films in a second stacking region, which is different from the first stacking region, are a-Si. Further, specifically, the dielectric film 120 mentioned above is a silicon oxide film formed by using TEOS.

As shown in FIG. 4, for the 1st to 12th layers in which p-Si films and TEOS films are alternately stacked, the warpage in the compression direction (here, referred to as "negative warpage") increases as the number of stacked layers increases. For the 13th and subsequent layers, the a-Si film of the first electrode film 131 is used as the electrode film 130, and the warpage in the tension direction (here, referred to as "positive warpage") increases as the number of stacked layers increases. The warpage is nearly zero for the approximately 20th layer in the aggregate, and the positive warpage increases when more layers are stacked.

Thus, in the case where p-Si films and TEOS films are alternately stacked, a warpage of compression (negative warpage) occurs and the warpage increases in the negative direction as increasing the number of stacked layers. On the other hand, in the case where a-Si films and TEOS films are alternately stacked, a warpage of tension (positive warpage) occurs and the warpage increases in the positive direction as increasing the number of stacked layers.

In the nonvolatile memory device 10 according to this embodiment, the number of electrode films 130 is 20 and the number is set so that the warpage may be minimized. More specifically, the warpage at this time is approximately 10 µm.

Thus, by the nonvolatile memory device 10 according to this embodiment, a nonvolatile memory device that reduces the warpage can be provided.

FIRST COMPARATIVE EXAMPLE

Figure 5:
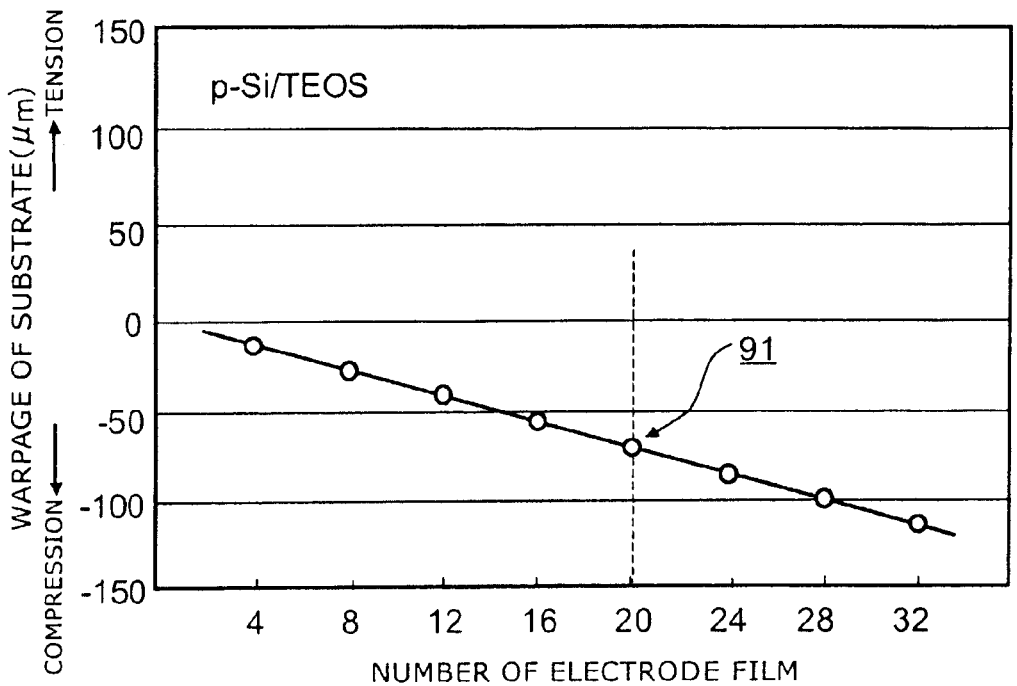
FIG. 5 is a graph chart illustrating the characteristics of a nonvolatile memory device of a first comparative example.

FIG. 5 is a graph chart illustrating the characteristics of a nonvolatile memory device of a first comparative example.

More specifically, a nonvolatile memory device 91 of the first comparative example has a configuration in which a p-Si film is used as the electrode film 130, a TEOS film is used as the dielectric film 120, and they are alternately stacked. Other than this, the configuration is similar to that of the nonvolatile memory device 10 according to the first embodiment.

As shown in FIG. 5, in the case of the nonvolatile memory device 91 of the first comparative example, since all the electrode films 130 are based on p-Si films, the warpage of the substrate increases nearly in a linear-function manner as the number of stacked electrode films 130 and dielectric films 120 increases. When the number of electrode films 130 is 20, a warpage of approximately 70 µm is brought about. Thus, in the nonvolatile memory device 91 of the first comparative example, the warpage of the substrate is large.

In contrast, as illustrated in FIG. 4, the nonvolatile memory device 10 according to this embodiment brings about a warpage of 10 µm, which is one seventh of that of the nonvolatile memory device 91 of the first comparative example. Thus, a combination of an a-Si film which generates a tensile stress and a p-Si film which generates a compressive stress is used as the electrode film 130 in the nonvolatile memory device 10 according to this embodiment, and thereby a nonvolatile memory device that reduces the warpage of the substrate is obtained.

Figure 6:
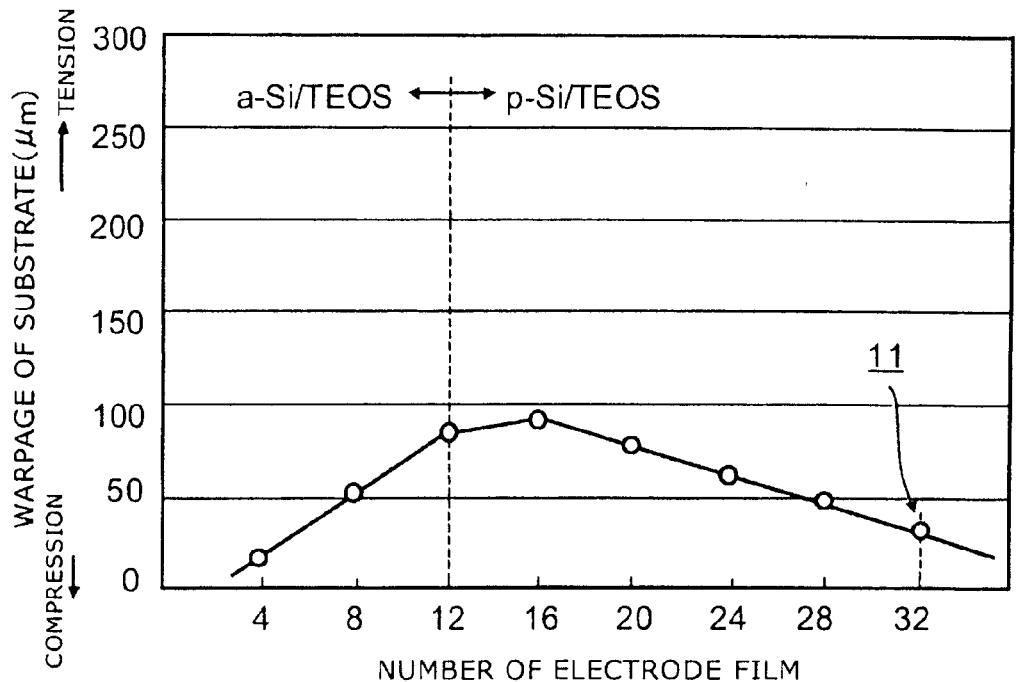
FIG. 6 is a graph chart illustrating the characteristics of another nonvolatile memory device according to the first embodiment of the present invention.

FIG. 6 is a graph chart illustrating the characteristics of another nonvolatile memory device according to the first embodiment of the present invention.

That is, the figure illustrates the results of an experiment on change in substrate warpage when a-Si films (first electrode films 131) and TEOS films (dielectric films 120) are alternately stacked on a semiconductor substrate and then p-Si films (second electrode films 132) and TEOS films (dielectric films 120) are alternately stacked. The horizontal axis represents the number of electrode films, and the vertical axis represents the amount of substrate warpage. In this experiment also, a semiconductor wafer with a diameter of 300 mm and a thickness of 750 µm is used as the substrate. Then, a-Si films and TEOS films are alternately stacked twelve times thereon to be formed into a film, and then p-Si films and TEOS films are alternately stacked as many times as corresponding to the 13th to 32nd layers in the aggregate to be formed into a film.

The nonvolatile memory device 11 according to this embodiment has a configuration in which 32 electrode films 130 are stacked.

As shown in FIG. 6, for the 1st to 12th layers in which a-Si films and TEOS films are alternately stacked, the warpage in the tension direction (positive warpage) increases as the number of stacked layers increases. For the 13th and subsequent layers, the p-Si film of the second electrode film 132 is used as the electrode film 130, and the warpage in the compression direction (negative warpage) increases to come close to zero in absolute value as the number of stacked layers increases. For the 32nd layer in the aggregate, the warpage is relatively small, i.e., approximately 30 µm.

Thus, the nonvolatile memory device 11 according to this embodiment is configured so that the warpage may be small when the number of stacked electrode layers 130 is 32.

Thus, by the nonvolatile memory device 11 according to this embodiment, a nonvolatile memory device that reduces the warpage can be provided.

SECOND COMPARATIVE EXAMPLE

Figure 7:
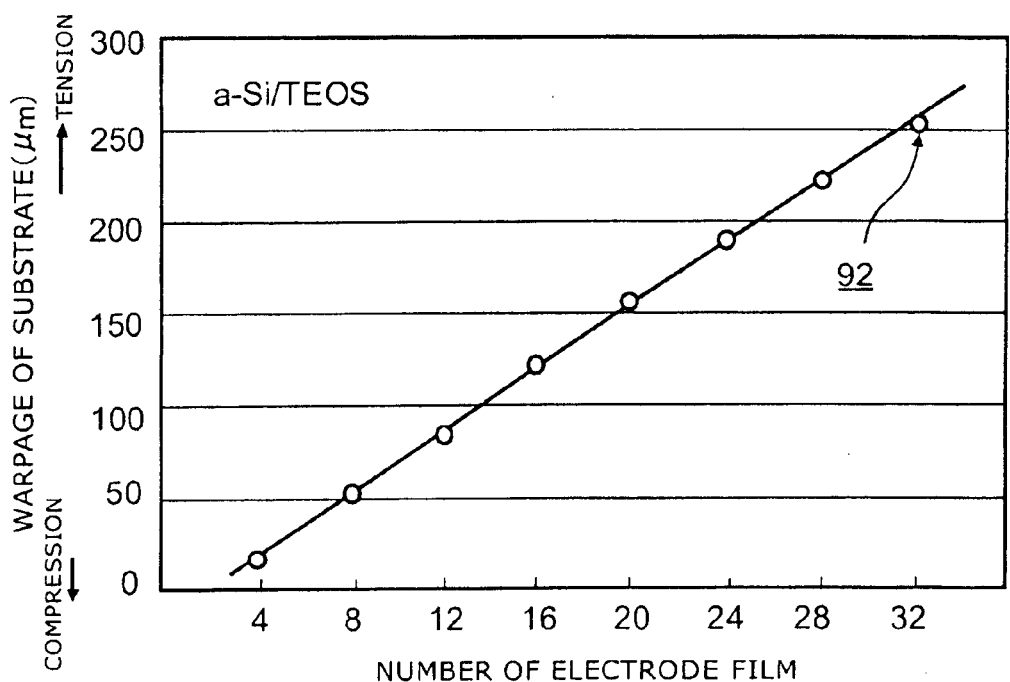
FIG. 7 is a graph chart illustrating the characteristics of a nonvolatile memory device of a second comparative example.

FIG. 7 is a graph chart illustrating the characteristics of a nonvolatile memory device of a second comparative example.

More specifically, a nonvolatile memory device 92 of the second comparative example has a configuration in which an a-Si film is used as the electrode film 130, a TEOS film is used as the dielectric film 120, and they are alternately stacked. Other than this, the configuration is similar to that of the other nonvolatile memory device 11 according to the first embodiment.

As shown in FIG. 7, in the case of the nonvolatile memory device 92 of the second comparative example, since all the electrode films 130 are based on a-Si films, the warpage of the substrate increases in the positive direction nearly in a linear-function manner as the number of stacked electrode films 130 and dielectric films 120 increases. When the number of electrode films 130 is 32, a warpage of approximately 250 μm is brought about. Thus, in the nonvolatile memory device 92 of the second comparative example, the warpage of the substrate is large.

In contrast, as illustrated in FIG. 6, the nonvolatile memory device 11 according to this embodiment brings about a warpage of 30 μm, which is one eighth of that of the nonvolatile memory device 92 of the second comparative example. Thus, a combination of a p-Si film which generates a compressive stress and an a-Si film which generates a tensile stress is used as the electrode film 130 in the nonvolatile memory device 11 according to this embodiment, and thereby a nonvolatile memory device that reduces the warpage of the substrate is obtained.

Figure 8:
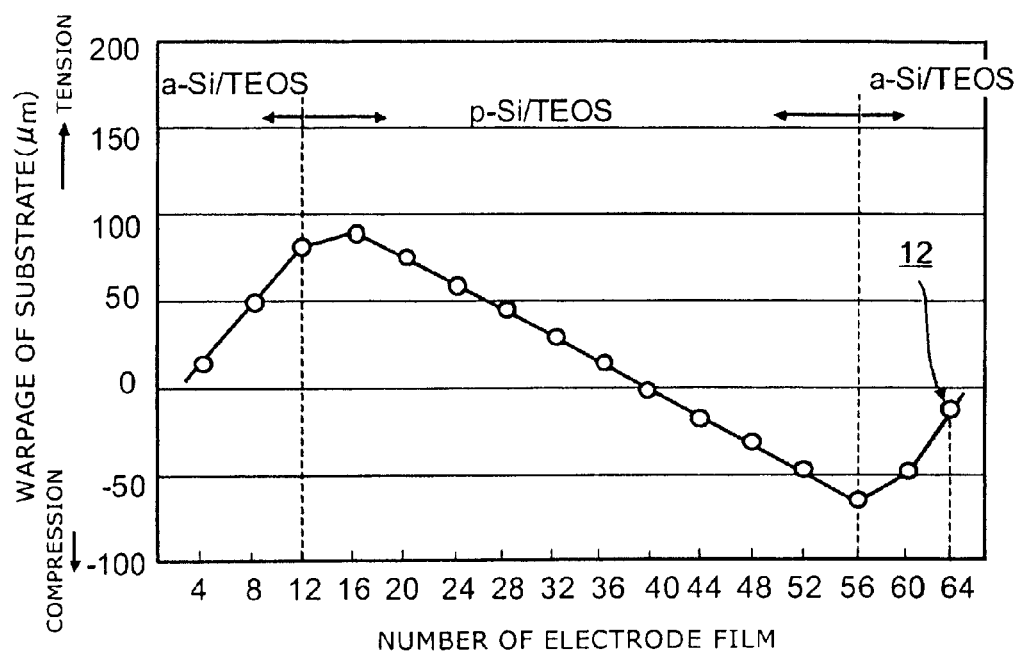
FIG. 8 is a graph chart illustrating the characteristics of another nonvolatile memory device according to the first embodiment of the present invention.

FIG. 8 is a graph chart illustrating the characteristics of another nonvolatile memory device according to the first embodiment of the present invention.

That is, the figure illustrates the results of an experiment on change in substrate warpage when a-Si films (first electrode films 131) and TEOS films (dielectric films 120) are alternately stacked on a semiconductor substrate and then p-Si films (second electrode films 132) and TEOS films (dielectric films 120) are alternately stacked, after which a-Si films (first electrode films 131) and TEOS films (dielectric films 120) are alternately stacked. The horizontal axis represents the number of electrode films, and the vertical axis represents the amount of substrate warpage.

In this experiment, a semiconductor wafer with a diameter of 300 mm and a thickness of 750 μm is used as the substrate, a-Si films and TEOS films are alternately film-formed thereon for the 1st to 12th layers, and then p-Si films and TEOS films are alternately stacked for the 13th to 56th layers in the aggregate to be formed into a film, after which a-Si films and TEOS films are stacked for the 57th to 64th layers in the aggregate to be formed into a film.

In the nonvolatile memory device 12 according to this embodiment, 64 electrode films 130 are stacked.

As shown in FIG. 8, for the 1st to 12th layers in which a-Si films and TEOS films are alternately stacked, the warpage in the tension direction (positive warpage) increases as the number of stacked layers increases. For the 13th to 56th layers in the aggregate in which the p-Si film of the first electrode film 131 is used as the electrode film 130, the warpage in the compression direction (negative warpage) increases as the number of stacked layers increases. For the 57th to 64th layers in which again a-Si films and TEOS films are alternately stacked, the warpage in the tension direction (positive warpage) increases again as the number of stacked layers increases. At the time when the number of layers is 64, the warpage is relatively small, i.e., approximately −10 μm.

Thus, the nonvolatile memory device 12 according to this embodiment can provide a nonvolatile memory device that reduces the warpage even when the number of stacked electrode films 130 is large, i.e., 64.

As the case of the nonvolatile memory device 12, a configuration in which a-Si films and TEOS films are alternately stacked and a configuration in which p-Si films and TEOS films are alternately stacked may be repeated multiple times. This can provide a nonvolatile memory device that reduces the warpage for a desired number of electrode films 130.

In regard to the nonvolatile memory device 12 of this specific example illustrated in FIG. 8, the case is supposed where the maximum acceptable value (absolute value) of warpage is 100 μm or less, for example. Therefore, so that the absolute value of the warpage may not exceed 100 μm, the 1st to 12th layers are based on a stacked layer of a-Si films and TEOS films, the 13th to 56th layers are based on a stacked layer of p-Si films and TEOS films, and the 57th to 64th layers are again based on a stacked film of a-Si films and TEOS films. That is, the switching between a-Si films and p-Si films is performed two times. Thereby, the maximum warpage (absolute value) during the manufacturing process is made 100 μm or less.

However, the present invention is not limited to this. For example, in the case where the maximum acceptable value (absolute value) of warpage is 150 μm or less, the 1st to 16th layers may be based on a stacked film of a-Si films and TEOS films, and the 17th to 64th layer may be based on a stacked film of p-Si films and TEOS films, for example. In this case also, the maximum warpage (absolute value) during the manufacturing process can be made 150 μm or less, while keeping the warpage relatively small when stacking the 64th layer.

In contrast, in the case where the maximum acceptable value (absolute value) of warpage is less than 100 μm, the switching between a stacked film of a-Si films and TEOS films, and a stacked film of p-Si films and TEOS films may be performed more times. This can decrease the maximum warpage (absolute value) during the manufacturing process. Thus, in the nonvolatile memory device according to this embodiment, the switching between a stacked film of a-Si films and TEOS films, and a stacked film of p-Si films and TEOS films is determined appropriately according to the required maximum acceptable value (absolute value) of warpage.

The amount of warpage for one a-Si film and one p-Si film used for the electrode film 130 varies also with the film-forming conditions or thickness of each film. Therefore, the switching between a stacked film of a-Si films and TEOS films, and a stacked film of p-Si films and TEOS films can be performed appropriately based on the amount of warpage for one layer according to the film-forming conditions and film thickness of a-Si films and p-Si films, and the like.

Further, the amount of warpage for one TEOS film used for the dielectric film 120 which is stacked together with the electrode film 130 varies also with the film-forming conditions or film thickness of the TEOS film. Therefore, the switching between a stacked film of a-Si films and TEOS films, and a stacked film of p-Si films and TEOS films can be performed appropriately based on the amount of warpage for one layer according to the film-forming conditions and film thickness of TEOS films, and the like.

The nonvolatile memory device according to this embodiment has a configuration in which a large number of electrode films 130 and dielectric films 120 are stacked to correspond to memory cells. In addition to this, various kinds of films are provided above the substrate 110 as illustrated in FIG. 1 and FIG. 2, for example. At this time, the type of electrode film 130 and dielectric film 120, and the number of electrode films 130 and dielectric films 120 can be determined so that the warpage may be held within a desired acceptable value for a body including: a stacked film of electrode films 130 corresponding to memory cells and dielectric films 120; and other films. This can provide a nonvolatile memory device in which the warpage is totally small for a body including not only a stacked film of electrode films 130 corresponding to memory cells and dielectric films 120 but also other films.

In the nonvolatile memory device according to this embodiment, Ge, which generates a compressive stress, may also be used in place of the p-Si film mentioned above, for example. In this case also, the warpage of the substrate can be reduced by effects similar to the aforementioned even in a configuration including a large number of stacked films.

In the nonvolatile memory device according to this embodiment, to reduce the warpage in a configuration in which a large number of electrode films 130 corresponding to memory cells and dielectric films 120 insulating electrode films 130 from each other are stacked, the electrode film 130 includes a film that generates a stress of which the type is different from that generated by the dielectric film 120.

Then, a number of the combination of the electrode films 130 and the dielectric films 120 is set so that the warpage may be reduced for the whole stacked layers.

For example, the dielectric films 120 may include a film that generates one of the compressive stress and the tensile stress. At this time, the electrode films 130 may include a film that has the other of the stresses mentioned above.

More specifically, when the dielectric films 120 include a film that generates a compressive stress, the electrode films 130 may include a film that generates a tensile stress.

Further, when the dielectric films 120 include a film that generates a tensile stress, the electrode films 130 may include a film that generates a compressive stress.

The TEOS film described above is a film that generates a compressive stress. Therefore, the electrode film 130 may include an a-Si film as a film that generates a tensile stress.

At this time, in the case where, for example, the difference between the absolute value of stress for one a-Si film and the absolute value of stress for one TEOS film is relatively small, a-Si films and TEOS films may be stacked repeatedly, which can compensate and cancel the stresses of the two and reduce the warpage.

Silicon nitride may be used for a film that generates a tensile stress or compressive stress, for example. At this time, the type of stress can be changed to either a tension type or compression type and the magnitude thereof can also be controlled by film-forming conditions such as plasma conditions.

Further, the stress difference between a-Si and p-Si depends on, for example, the amount of hydrogen atoms in the film and can be controlled by controlling the amount of hydrogen atoms by, for example, the conditions during film-formation.

Furthermore, the type and magnitude of stress of various kinds of films such as a silicon nitride film and silicon oxide film vary with the type and concentration of impurity contained therein, water, and the like. The specific example mentioned above is one example. The present invention uses a combination of films having compression properties and tension properties which are generated on the bases of the conditions during film-formation, impurities contained, and the like in addition to the materials used, and thereby reduces the warpage of the substrate even in a configuration including a large number of stacked films.

Furthermore, for example, a plasma CVD film-formed $SiO_2$ film, a plasma CVD film-formed SiN film, a low pressure CVD film-formed polycrystalline silicon film and so forth may be also used for the film generating the compressive stress.

For example, a low pressure CVD film-formed TEOS film, a low pressure CVD film-formed SiN film, a TEOS/$O_3$ film-formed film, a polycrystalline silicon film formed from an amorphous silicon film and so forth may be also used for the film generating the tensile stress.

Figure 9:
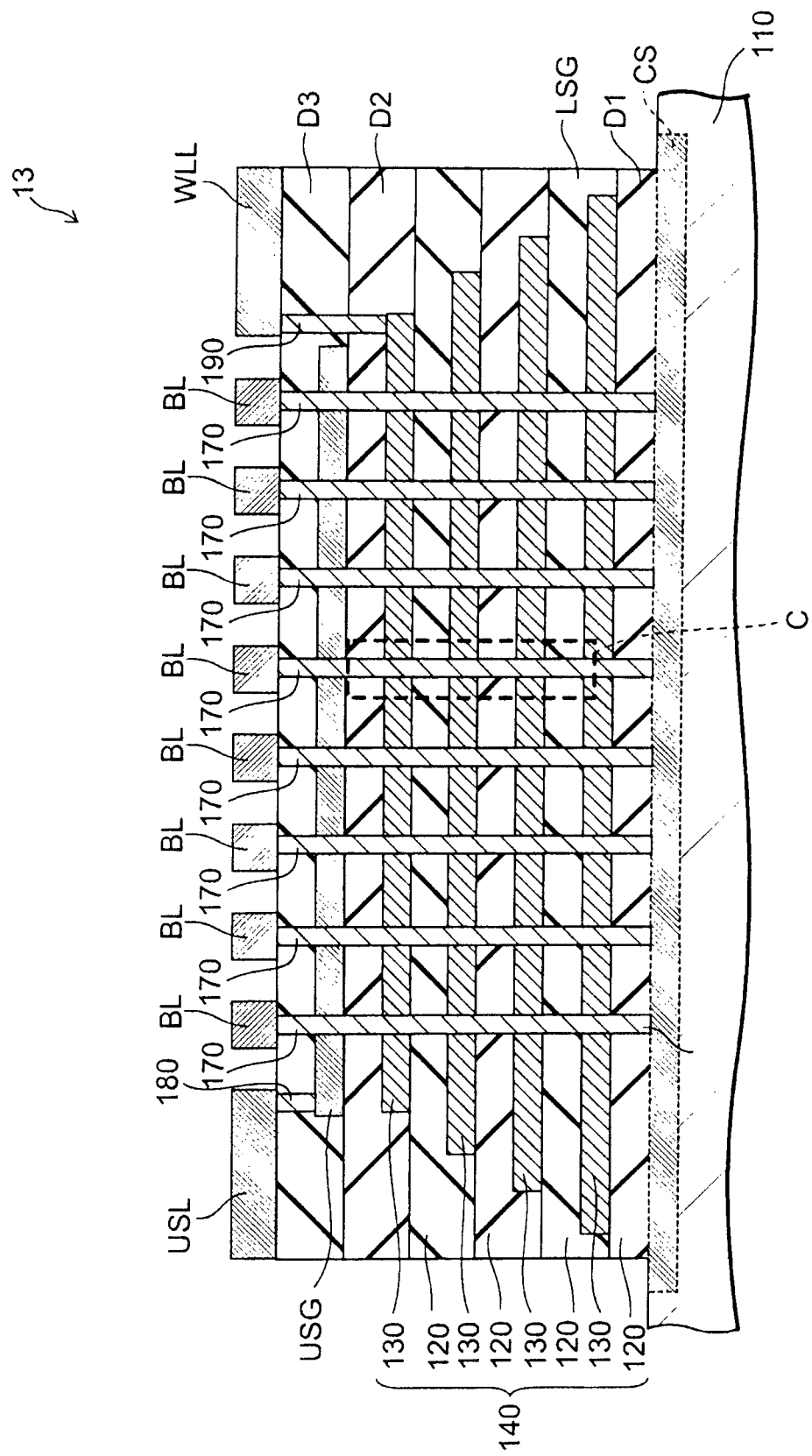
FIG. 9 is a schematic cross-sectional view illustrating a configuration of another nonvolatile memory device according to the first embodiment of the present invention.

FIG. 9 is a schematic cross-sectional view illustrating a configuration of another nonvolatile memory device according to the first embodiment of the present invention.

Figure 10:
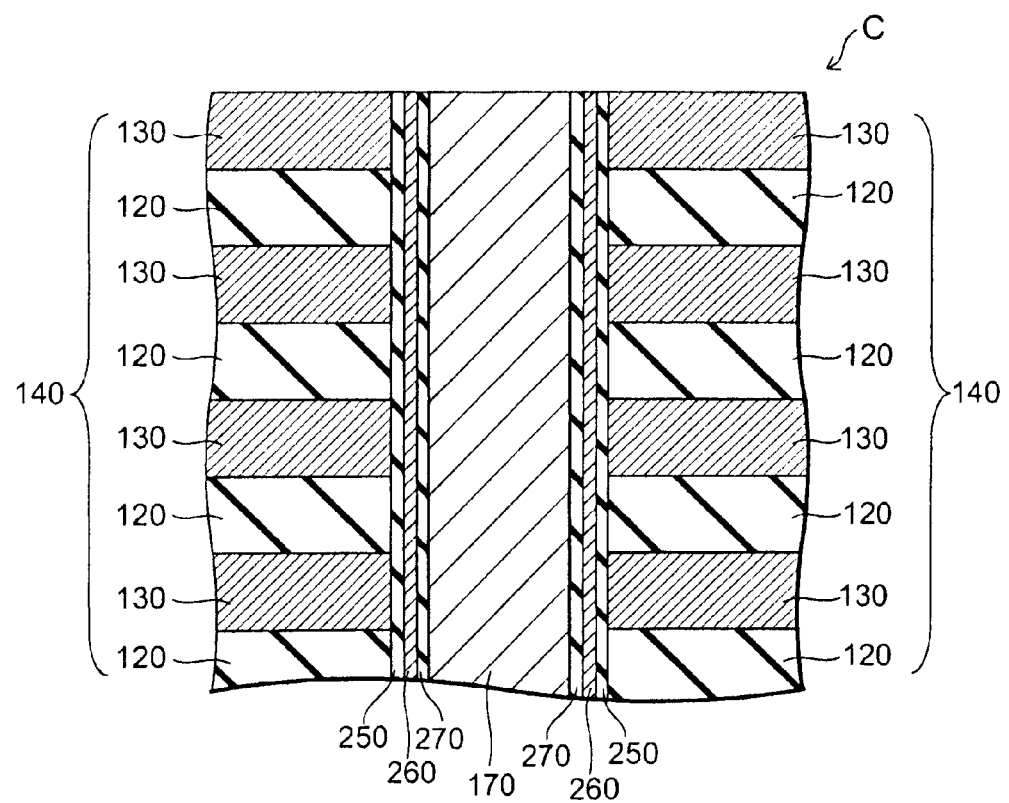
FIG. 10 is a schematic cross-sectional view illustrating the configuration of the other nonvolatile memory device according to the first embodiment of the present invention.

FIG. 10 is a schematic cross-sectional view illustrating the configuration of the other nonvolatile memory device according to the first embodiment of the present invention.

That is, FIG. 9 is a cross-sectional view corresponding to a cross-section taken along line A-A' shown in FIG. 2. FIG. 10 is a schematic enlarged cross-sectional view of the C portion shown in FIG. 9.

As shown in FIG. 9, in a nonvolatile memory device 13 according to this embodiment, the electrode films 130 of one type are used. That is, instead of two types, i.e., the first electrode film 131 and the second electrode film 132, the electrode films 130 of one type are used. Other than this, the configuration is similar to that of the nonvolatile memory device 10 described previously, and a description is therefore omitted.

In the nonvolatile memory device 13 according to this embodiment illustrated in FIG. 9 and FIG. 10, the dielectric films 120 are based on TEOS films that generate a compressive stress, and on the other hand the electrode films 130 are based on conductive films that generate a tensile stress. In the case of this specific example, the absolute value of compressive stress for one TEOS film used for the dielectric film 120 and the absolute value of tensile stress for one conductive film used for the electrode film 130 are substantially equal. That is, the stacked electrode films 130 and dielectric films 120 are configured so that stresses having opposite directions and nearly-equal absolute values may be generated. This can suppressed the warpage even when a large number of electrode films 130 and dielectric films 120 are stacked.

Thus, also in the nonvolatile memory device 13 according to this embodiment, the electrode films 130 and the dielectric films 120 are configured so that stresses having opposite directions and nearly-equal absolute values may be generated. Therefore, a nonvolatile memory device that reduces the warpage is obtained even when a large number of electrode films 130 and dielectric films 120 are stacked.

At this time, in the case where, for example, the absolute value of stress for one electrode film 130 (for example, an a-Si film) and the absolute value of stress for one dielectric film 120 (for example, a TEOS film) are different, when the electrode films 130 and the dielectric films 120 are simply stacked repeatedly, then the stress of the difference between both the absolute values is accumulated and the warpage increases as increasing the number of stacked films.

At this time, as described in regard to the nonvolatile memory devices 10, 11, and 12 mentioned above, the accumulated stress of the difference between the absolute values of stress of the a-Si film and TEOS film is eliminated by inserting a stacked structure of a p-Si layer which generates a compressive stress and a TEOS film as appropriate.

That is, the electrode film 130 may include the second electrode film 132 that generates at least one of the compressive stress and the tensile stress mentioned above and the first electrode film 131 that generates the other of the stresses.

More specifically, when the dielectric films 120 include a film that generates the compressive stress, the electrode films 130 may include the first electrode film 131 that generates the tensile stress and the second electrode film 132 that generates the compressive stress.

Further, when the dielectric films 120 include a film that generates the tensile stress, the electrode films 130 may include the first electrode film 131 that generates the compressive stress and the second electrode film 132 that generates the tensile stress.

That is, the TEOS film used for the dielectric film 120 described above is a film that generates the compressive stress, and at this time, the electrode films 130 may include the first electrode film 131 (a-Si film) that generates the tensile stress and the second electrode film 132 (p-Si film) that generates the compressive stress. Like the nonvolatile memory devices 10, 11, and 12 according to this embodiment described previously, the numbers of first electrode films 131 (a-Si films) and second electrode films 132 (p-Si films) are appropriately selected so that the warpage may be small when all the layers are stacked. Thereby, a nonvolatile memory device that reduces the warpage is obtained.

In the aforementioned, examples are described in which two types are used as the electrode film 130, that is, the first electrode film 131 and the second electrode film 132 which generates a stress of the direction opposite to that of the first electrode film 131. However, the present invention is not limited to them, but the first electrode film 131 may include a plurality of films that have a plurality of absolute values of stress. Further, the second electrode film 132 may include a plurality of films that have a plurality of absolute values of stress.

That is, in the specific example illustrated in FIG. 4, for example, although the 13th to 32nd layers are a-Si films which are the first electrode films 131, the gradient of substrate warpage with respect to the number of layers for the 13th to 16th layers is different from the gradient for the 17th to 32nd layers as shown in FIG. 4. More specifically, the a-Si films (the first electrode films 131) of the 13th to 16th layer and the a-Si films (the first electrode films 131) of the 17th to 32nd layers are different in absolute value of stress. Thus, the first electrode film 131 and the second electrode film 132 may include a plurality of films that have a plurality of absolute values of stress.

In other words, in the nonvolatile memory device according to this embodiment, the electrode films 130 may include a third conductive film that generates a stress of a direction identical or opposite to that of the first electrode film 131, in addition to the first electrode film 131 and the second electrode film 132 which generates a stress of the direction opposite to that of the first electrode film 131.

In the nonvolatile memory device according to this embodiment mentioned above, in the case where the electrode films 130 are formed by mixing a-Si films and p-Si films, the nonvolatile memory device may not operate properly or the design and manufacturing conditions for proper operating may be limited to a narrow range, due to a difference in specific resistance between the two. For this case, the type, concentration, and the like of impurities in the a-Si films and p-Si films may be controlled appropriately, for example, and thereby the difference in specific resistance between the a-Si films and p-Si films can be controlled to a practical acceptable range. Therefore, this problem can be resolved.

Thus, the specific resistances of the first electrode film 131 and the second electrode film 132 may be configured to be substantially equal. Thereby, in the nonvolatile memory device according to this embodiment, an appropriate range of the design and manufacturing conditions for proper operating can be ensured.

Second Embodiment

A method for manufacturing a nonvolatile memory device according to a second embodiment of the present invention is for manufacturing a nonvolatile memory device including: a substrate; a stacked structure member including a plurality of dielectric films and a plurality of electrode films alternately stacked on the substrate and including a through-hole which penetrates through the plurality of the dielectric films and the plurality of the electrode films in the stacking direction of the plurality of the dielectric films and the plurality of the electrode films; a semiconductor pillar formed in the through-hole; and a charge storage layer provided between the semiconductor pillar and each of the plurality of the electrode films. The method for manufacturing a nonvolatile memory device according to this embodiment has a feature in the method for manufacturing the dielectric films and the electrode films mentioned above, and therefore the method for manufacturing the dielectric films and the electrode films will be described.

Figure 11:
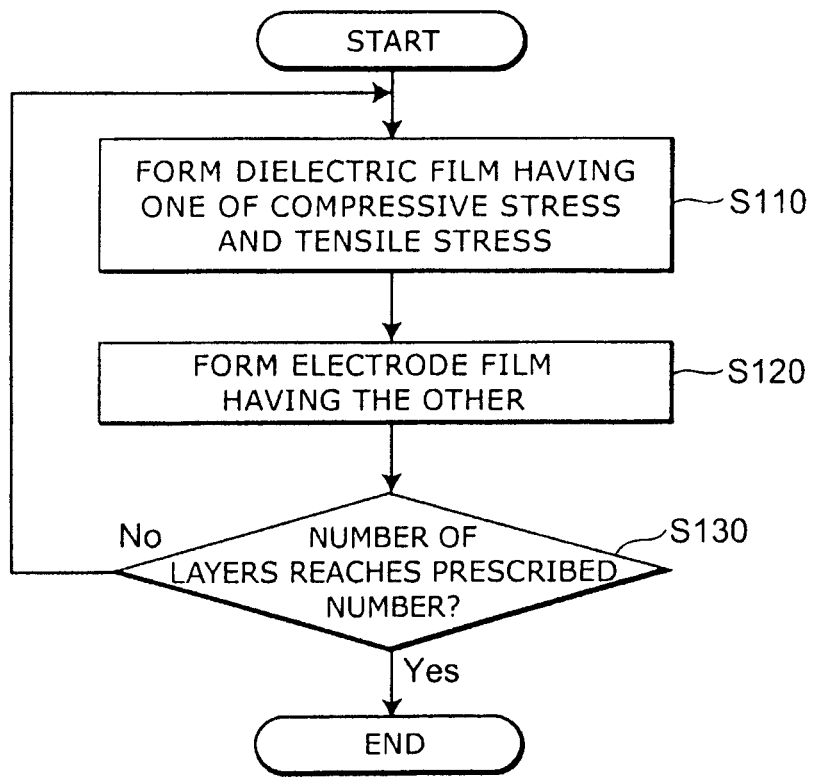
FIG. 11 is a flow chart illustrating a method for manufacturing a nonvolatile memory device according to a second embodiment of the present invention.

FIG. 11 is a flow chart illustrating the method for manufacturing a nonvolatile memory device according to the second embodiment of the present invention.

As shown in FIG. 11, in the method for manufacturing a nonvolatile memory device according to the second embodiment of the present invention, first, a dielectric film that generates one of a compressive stress and a tensile stress is formed (step S110). For example, as described previously, a TEOS film which forms the dielectric film 120 is formed. At this time, a film that generates a compressive stress is formed.

Then, an electrode film that generates the other of the stresses is formed (step S120). For example, in the case where the TEOS film which generates a compressive stress is formed as the dielectric film 120, an a-Si film which generates a tensile stress is formed as the electrode film 130.

Then, step S110 and step S120 mentioned above are repeated until the number of layers reaches a prescribed number (step S130).

Thereby, a method for manufacturing a nonvolatile memory device can be provided in which the stresses of the dielectric film 120 and the electrode film 130 are compensated and the warpage of the substrate is small even in a configuration including a large number of stacked films.

Figure 12:
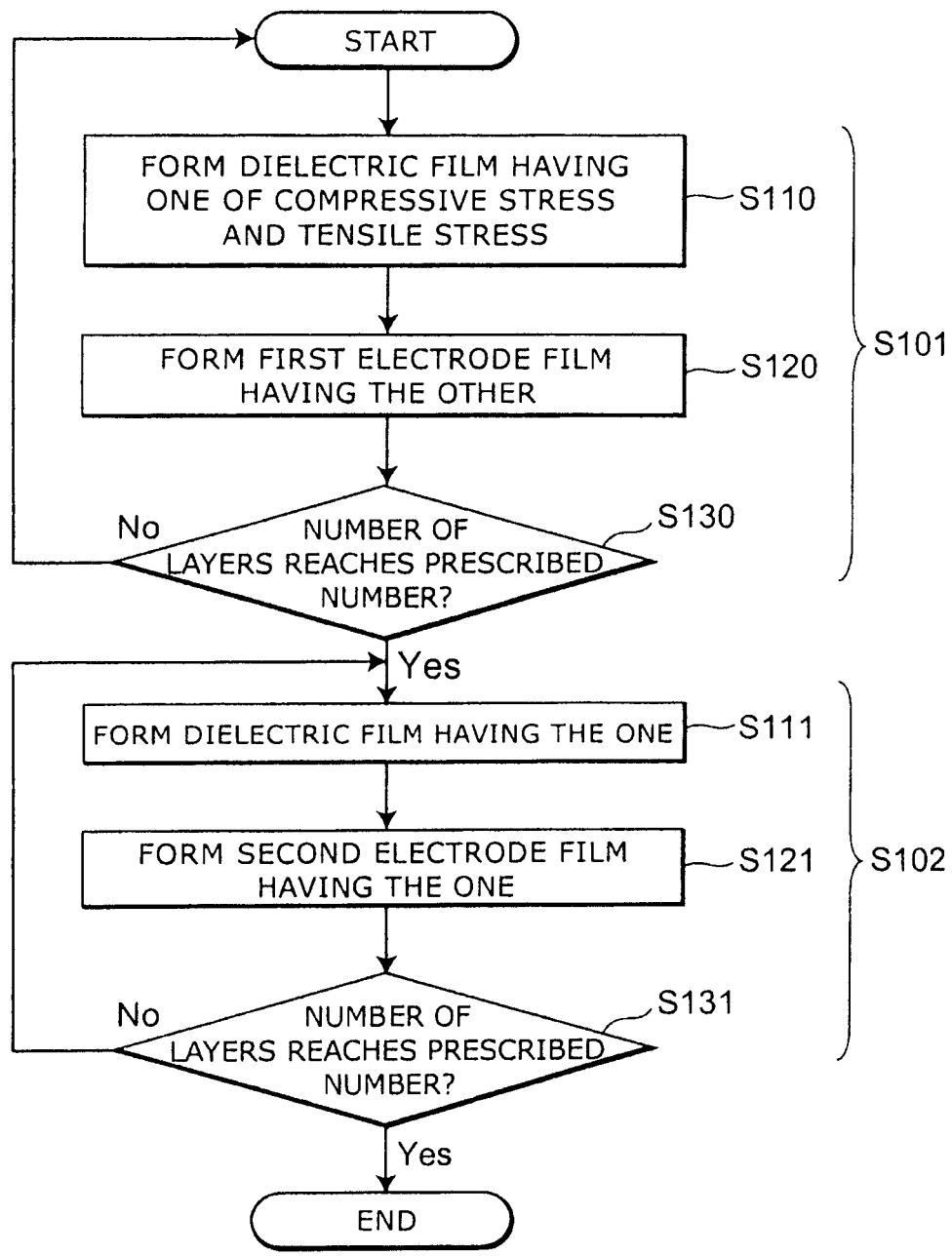
FIG. 12 is a flow chart illustrating a method for manufacturing another nonvolatile memory device according to the second embodiment of the present invention.

FIG. 12 is a flow chart illustrating a method for manufacturing another nonvolatile memory device according to the second embodiment of the present invention.

As shown in FIG. 12, for the nonvolatile memory device according to the second embodiment of the present invention, first, a dielectric film that generates one of the compressive stress and the tensile stress is formed (step S110). For example, as described previously, a TEOS film which forms the dielectric film 120 is formed. At this time, a film that generates a compressive stress can be formed.

Then, the first electrode film 131 that generates the other of the stresses is formed (step S120). For example, in the case where the TEOS film which generates a compressive stress is formed as the dielectric film 120, an a-Si film which generates a tensile stress is formed as the first electrode film 131.

Then, step S110 and step S120 mentioned above are repeated until the number of layers reaches a prescribed number (step S130).

Further, a dielectric film that generates one of the compressive stress and the tensile stress is formed (step S111). More specifically, for example, a TEOS film which generates a compressive stress is formed as the dielectric film 120.

Then, the second electrode film 132 that generates the one of the stresses is formed (step S121). For example, a p-Si film which generates a compressive stress is formed as the second electrode film 132.

After that, step S111 and step S121 mentioned above are repeated until the number of layers reaches a prescribed number (step S131).

Thus, in the case where there is a difference in absolute value of stress between the dielectric film 120 and the first electrode film 131, the second electrode film 132 that generates a stress of the direction opposite to that of the first electrode film 131 may be stacked. This reduces the difference in absolute value of stress.

As described above, this embodiment can provide a method for manufacturing a nonvolatile memory device in which the stresses of the dielectric film 120 and the electrode film 130 (the first electrode film 131 and the second electrode film 132) can be compensated and the warpage of the substrate is small even in a configuration including a large number of staked films.

The order of step S101 including step S110 to step S130 mentioned above and step S102 including step S111 to step S131 mentioned above may be changed. Further, step S101 and step S102 may be performed more than once.

Figure 13:
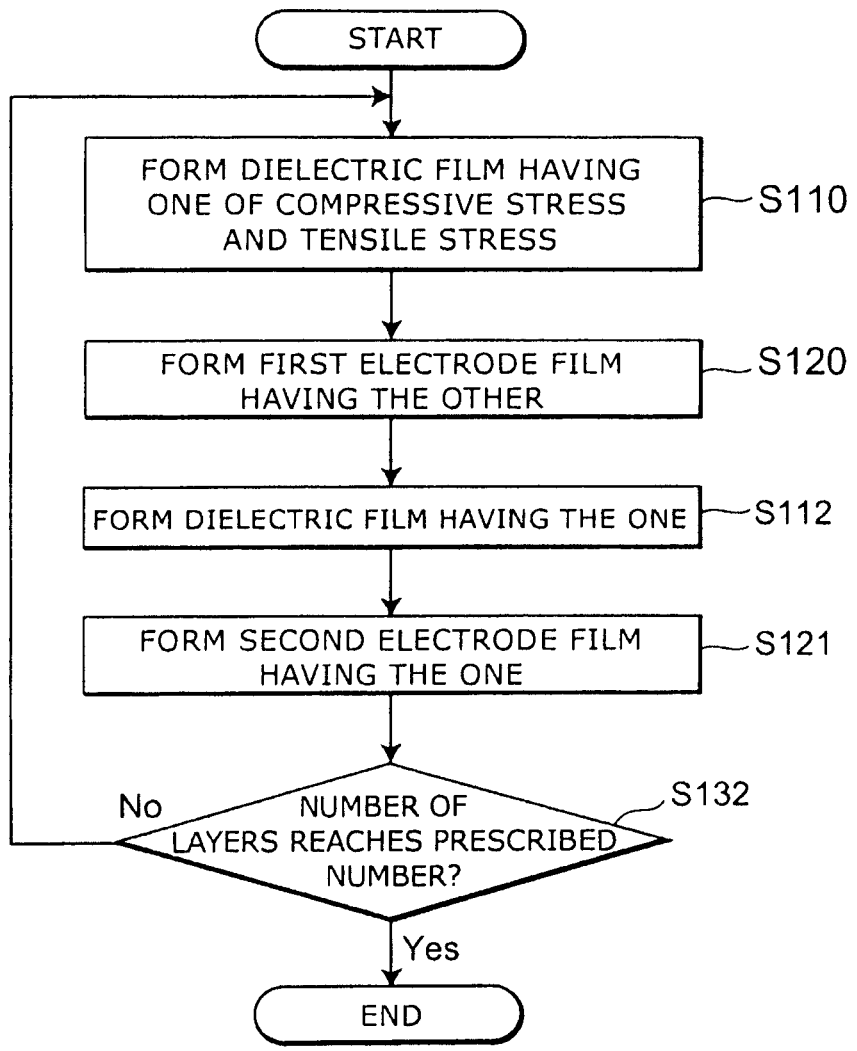
FIG. 13 is a flow chart illustrating a method for manufacturing another nonvolatile memory device according to the second embodiment of the present invention.

FIG. 13 is a flow chart illustrating a method for manufacturing another nonvolatile memory device according to the second embodiment of the present invention.

As shown in FIG. 13, for the nonvolatile memory device according to the second embodiment of the present invention, first, a dielectric film that generates one of the compressive stress and the tensile stress is formed (step S110). For example, as described previously, a TEOS film which forms the dielectric film 120 is formed. At this time, a film that generates a compressive stress can be formed.

Then, the first electrode film 131 that generates the other of the stresses is formed (step S120). For example, in the case where the TEOS film which generates a compressive stress is formed as the dielectric film 120, an a-Si film which generates a tensile stress is formed as the first electrode film 131.

Then, a dielectric film that generates the one of the stresses is formed (step S112). More specifically, a TEOS film which forms the dielectric film 120 is formed.

Then, the second electrode film 132 that generates the one of the stresses is formed (step S112). For example, a p-Si film which generates a compressive stress is formed as the second electrode film 132.

After that, step S110 to step S121 mentioned above are repeated until the number of layers reaches a prescribed number (step S132).

That is, in the case of manufacturing equipment for a nonvolatile memory device illustrated in FIG. 13, the first electrode film 131 and the second electrode film 132, which generate stresses of directions opposite to each other, are alternately stacked via the dielectric film 120.

In this case also, the stresses of the dielectric film 120 and the electrode film 130 (the first electrode film 131 and the second electrode film 132) can be compensated, and a method for manufacturing a nonvolatile semiconductor device can be provided in which the warpage of the substrate is small even in a configuration including a large number of stacked layers.

The method for manufacturing a nonvolatile memory device illustrated in FIG. 12 and the method for manufacturing a nonvolatile memory device illustrated in FIG. 13 may be combined.

Thus, in this method, a plurality of first films (the dielectric films 120) and a plurality of second films (the electrode films 130) are formed on a substrate stacking alternately. At least one of the plurality of the first films generates one of a compressive stress and a tensile stress. At least one of the plurality of the second films generates the other of the compressive stress and the tensile stress. Each of the second films is conductive. And, a memory unit (the charge storage layer 260) opposing to at least one of the plurality of the second films is formed. The forming the memory unit includes: forming a through-hole penetrating through the plurality of the first films and the plurality of the second films in a stacking direction; forming a semiconductor pillar 170 in the through-hole; and forming a charge storage layer between the semiconductor pillar 170 and each of the plurality of the second film.

Third Embodiment

A nonvolatile memory device according to a third embodiment of the present invention is an example of a nonvolatile memory device including stacked structures, each in which a recording layer based on, for example, a resistance-change film and a rectifying element are placed between a pair of electrodes.

FIGS. 14A to 14C are schematic views illustrating a configuration of the nonvolatile memory device according to the third embodiment of the present invention.

That is, FIG. 14A is a schematic perspective view, FIG. 14B is a cross-sectional view taken along line A-A' shown in FIG. 14A, and FIG. 14C is a cross-sectional view taken along line B-B' shown in FIG. 14A.

Figure 15:
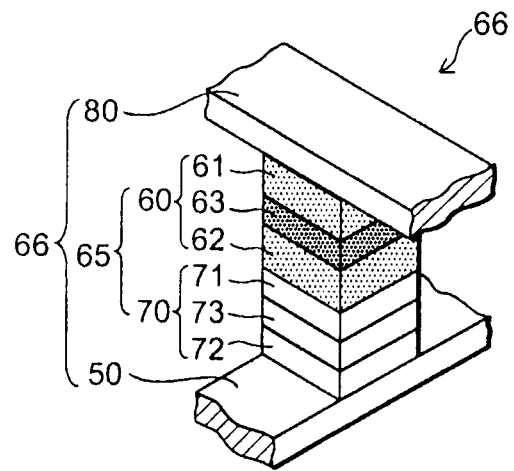
FIG. 15 is a schematic perspective view illustrating a configuration of a portion of the nonvolatile memory device according to the third embodiment of the present invention.

FIG. 15 is a schematic perspective view illustrating a configuration of a portion of the nonvolatile memory device according to the third embodiment of the present invention.

That is, FIG. 15 illustrates one element memory layer of the nonvolatile memory device.

As shown in FIGS. 14A to 14C, a nonvolatile memory device 30 according to the third embodiment of the present invention has a configuration in which a plurality of element memory layers 66 are stacked. Each element memory layer 66 includes: a first wiring 50; a second wiring 80 provided nonparallel to the first wiring 50; and a stacked structure body 65 provided between the first wiring 50 and the second wiring 80 and including a recording layer 60 and a rectifying element 70.

In the lowermost element memory layer 66 of the nonvolatile memory device 30, the first wiring 50 is a word line WL11, WL12, or WL13, and the second wiring 80 is a bit line BL11, BL12, or BL13, for example. In the second lowest element memory layer 66, the first wiring 50 is a word line WL21, WL22, or WL23, and the second wiring 80 is a bit line BL11, BL12, or BL13, for example. In the third lowest element memory layer 66, the first wiring 50 is a word line WL21, WL22, or WL23, and the second wiring 80 is a bit line BL21, BL22, or BL23, for example. In the uppermost (fourth lowest) element memory layer 66, the first wiring 50 is a word line WL31, WL32, or WL33, and the second wiring 80 is a bit line BL21, BL22, or BL23, for example.

In the case of the nonvolatile memory device 30, four element memory layers 66 are stacked. However, in the nonvolatile memory device according to this embodiment, the number of stacked element memory layers 66 is optional.

Such a nonvolatile memory device may be provided on a semiconductor substrate. At this time, each element memory layer 66 may be placed parallel to the principal plane of the semiconductor substrate. In other words, a plurality of element memory layers are stacked parallel to the principal plane of the semiconductor substrate.

In FIGS. 14A to 14C, to avoid complicatedness, three first wirings 50 (word lines) and three second wirings 80 (bit lines) are illustrated in each element memory layer 66. However, in the nonvolatile memory device 30 according to this embodiment, the numbers of first wirings 50 and second wirings 80 are optional, and the number of first wirings 50 and the number of second wirings 80 may be different.

The first wiring 50 (word line) and the second wiring 80 (bit line) are shared between adjacent element memory layers 66.

That is, as shown in FIGS. 14B and 14C, the word lines WL21, WL22 and WL23 are shared between the upper and lower element memory layers, and the bit lines BL11, BL12 and BL13, and the bit lines BL21, BL22 and BL23 are shared between the upper and lower element memory layers. However, the present invention is not limited to this. Word lines and bit lines may be provided independently in each stacked element memory layer 66. In the case where word lines and bit lines are provided independently in each memory layer 66, the extending direction of the word lines and the extending direction of the bit lines may vary with different element memory layers 66.

Here, the first wiring 50 is defined as a word line and the second wiring 80 is defined as a bit line. However, the first wiring 50 may be defined as a bit line and the second wiring 80 may be defined as a word line. That is, in the nonvolatile memory device and the method for manufacturing the same according to the embodiments described below, the bit line and the word line may be replaced with each other. In the following, a description is provided for the case where the first wiring 50 is a word line and the second wiring 80 is a bit line.

As shown in FIGS. 14B and 14C, in each element memory layer 66, the stacked structure body 65 including the recording layer 60 and the rectifying element 70 is provided at a position (crosspoint) where the first wiring 50 and the second wiring 80 intersect with each other three-dimensionally. The nonvolatile memory device 30 is what is called a crosspoint-type nonvolatile memory device. The recording layer 60 at each crosspoint forms one memory unit, and the stacked structure body 65 including this recording layer 60 forms one cell.

As described later, an electrode (a first conductive layer and a second conductive layer) is provided on, for example, both sides or one side of the recording layer 60 to form a recording unit (memory unit). However, in FIGS. 14A to 14C, these electrodes are omitted and only the recording layer 60 is illustrated.

In the example shown in FIGS. 14B and 14C, the rectifying element 70 is provided on the first wiring 50 side, and the recording layer 60 (and the recording unit described later) is provided on the second wiring 80 side. However, the recording layer 60 may be provided on the first wiring 50 side, and the rectifying element 70 may be provided on the second wiring 80 side. Further, the stacking order of the rectifying element 70 and the recording layer 60 with respect to the first wiring 50 and the second wiring 80 may vary with different element memory layers 66. Thus, the stacking order of the rectifying element 70 and the recording layer 60 is optional.

As shown in FIG. 15, the recording layer 60 may include a first barrier metal 61, a recording unit 63 (memory unit), and a second barrier metal 62. The first and second barrier metals 61 and 62 mentioned above are provided as needed. In the case where, for example, the recording unit 63 is a phase-change element, at least one of the first and second barrier metals 61 and 62 may serve also as a heater.

The recording unit 63 of the recording layer 60 may be based on a resistance-change material of which the resistance changes according to a voltage applied to the both sides thereof. More specifically, the recording unit 63 may include, for example, at least one selected from a group consisting of $NbO_x$, Cr-doped $SrTiO_{3-x}$, $Pr_xCa_yMnO_z$, $ZrO_x$, $NiO_x$, Ti-doped $NiO_x$, $ZnO_x$, $TiO_x$, $TiO_xN_y$, $CuO_x$, $GdO_x$, $CuTe_x$, $HfO_x$, $ZnMn_xO_y$, and $ZnFe_xO_y$. Further, it may include a material in which two or more of the materials mentioned above are mixed. Furthermore, a configuration in which a plurality of layers, each made of these materials, are stacked may be used.

Further, the recording unit 63 of the recording layer 60 may be based on a phase-change material of which the resistive state changes according to Joule heat generated by a voltage applied, such as a chalcogenide-based material. More specifically, the recording unit 63 may include, for example, at least one selected from a group consisting of chalcogenide-based GST ($Ge_xSb_yTe_z$), N-doped GST and O-doped GST made by performing doping on GST, $Ge_xSb_y$, and $In_xGe_yTe_z$. Furthermore, a configuration in which a plurality of layers, each made of these materials, are stacked may be used.

On the other hand, the rectifying element 70 includes a first semiconductor layer 71 (a first rectifying element film) and a second semiconductor layer 72 (a second rectifying element film). A $p^+$-type p-Si film, for example, may be used for the first semiconductor layer 71, and an $n^+$-type a-Si film, for example, may be used for the second semiconductor layer 72.

A third semiconductor layer 73 may be provided between the first semiconductor layer 71 and the second semiconductor layer 72. An intrinsic semiconductor, for example, may be used for the third semiconductor layer 73. That is, a pin diode is used as the rectifying element 70.

A large number of element memory layers 66 are stacked in the nonvolatile memory device 30 according to this embodiment having such a configuration. That is, a large number of rectifying elements 70, each of which is a part of the stacked structure body 65, are stacked.

At this time, in the nonvolatile memory device 30 according to this embodiment, the first semiconductor layer 71 included in the pin diode of the rectifying element 70 may be based on a compressive p-Si film, and the second semiconductor layer 72 may be based on a tensile a-Si film. This can provide a nonvolatile memory device in which the warpage of the substrate is small even in a configuration including a large number of element memory layers 66 stacked therein.

If only a p-Si film is used for both the first semiconductor layer 71 and the second semiconductor layer 72, which are included in the pin diode of the rectifying element 70, then the compressive stress of the p-Si film is accumulated and the warpage of the substrate increases in the compression direction as increasing the number of stacked layers. If only an a-Si film is used for both the first semiconductor layer 71 and the second semiconductor layer 72, then the tensile stress of the a-Si film is accumulated and the warpage of the substrate increases in the tension direction as increasing the number of stacked layers.

In contrast, in the nonvolatile memory device 30 according to this embodiment, the first semiconductor layer 71 may be based on a compressive p-Si film and the second semiconductor layer 72 may be based on a tensile a-Si film, and thereby the stresses of the p-Si film and the a-Si film can be canceled and the warpage of the substrate is decreased.

In the aforementioned, the first semiconductor layer 71 may be based on a tensile a-Si film and the second semiconductor layer 72 may be based on a compressive p-Si film.

In the case where the rectifying element 70 includes the third semiconductor layer 73, a compressive or tensile film may be used for the third semiconductor layer 73. At this time, it is possible to use a film that generates a stress of such a direction as to cancel a stress difference between the first semiconductor layer 71 and the second semiconductor layer 72. Thereby, in the case where there is a difference in absolute value of stress between the first semiconductor layer 71 and the second semiconductor layer 72, the difference can be further decreased and the warpage can be decreased further.

In the specific example mentioned above, a description is provided for an example that uses a $p^+$-type p-Si film for the first semiconductor layer 71 and an $n^+$-type a-Si film for the second semiconductor layer 72. However, the conduction type of semiconductor layer is optional, and the type of impurity added is also optional. That is, in regard to the rectifying element 70, a film that generates a compressive stress for the first semiconductor layer 71 and a film that generates a tensile stress for the second semiconductor layer 72 are used; or a film that generates a tensile stress for the first semiconductor layer 71 and a film that generates a compressive stress for the second semiconductor layer 72 are used. The type of stress, namely, compressive stress or tensile stress, of a film used for the first semiconductor layer 71 and the second semiconductor layer 72 may vary with different stacked element memory layers 66.

The rectifying element 70 has more preferably a PIN configuration in regard to stable operation. In this case, the p-type semiconductor layer and the intrinsic semiconductor layer may have compression properties, and the n-type semiconductor layer may have tension properties, for example. Alternatively, the reverse of the combination mentioned above may be used. Alternatively, the p-type semiconductor layer may have compression properties, and the intrinsic semiconductor layer and the n-type semiconductor layer may have tension properties. Alternatively, the reverse of the combination mentioned above may be used.

In the nonvolatile memory device 30 according to this embodiment, the rectifying element 70 includes the first rectifying element film (the first semiconductor layer 71) that generates one of the compressive stress and the tensile stress and the second rectifying element film (the second semiconductor layer 72) that generates the other of the stresses.

This can provide a nonvolatile memory device in which the warpage of the substrate is small even in a configuration including a large number of element memory layers 66 stacked therein.

Thus, in the nonvolatile memory device 30, a plurality of first films (the first rectifying element film, i.e., the first semiconductor layer 71) and a plurality of second films (the second rectifying element film, i.e., the second semiconductor layer 72) are stacked alternately. At least one of the plurality of the first films generates one of the compressive stress and the tensile stress. At least one of the plurality of the second films generates the other of the compressive stress and the tensile stress. Each of the second films has conductivity. A memory unit (the recording unit 63) opposing to at least one of the plurality of the second films is provided.

Further, between stacked layers having the first film and the second film, at least one of a first wiring 50 and a second wiring 80 which is nonparallel to the first wiring 50 are provided. Furthermore, the memory unit (the recording unit 63) is provided between the first wiring 50 and the second wiring 80.

Fourth Embodiment

A method for manufacturing a nonvolatile memory device according to a fourth embodiment of the present invention is for manufacturing a nonvolatile memory device in which a plurality of element memory layers 66 are stacked. Each element memory layer 66 includes: a first wiring 50; a second wiring 80 provided nonparallel to the first wiring 50; a stacked structure body 65 provided between the first wiring 50 and the second wiring 80 and including a recording layer 60 and a rectifying element 70. The method for manufacturing a nonvolatile memory device according to this embodiment has a feature in the method for forming the rectifying element 70 mentioned above, and therefore the method for forming the rectifying element 70 will be described first.

Figure 16:
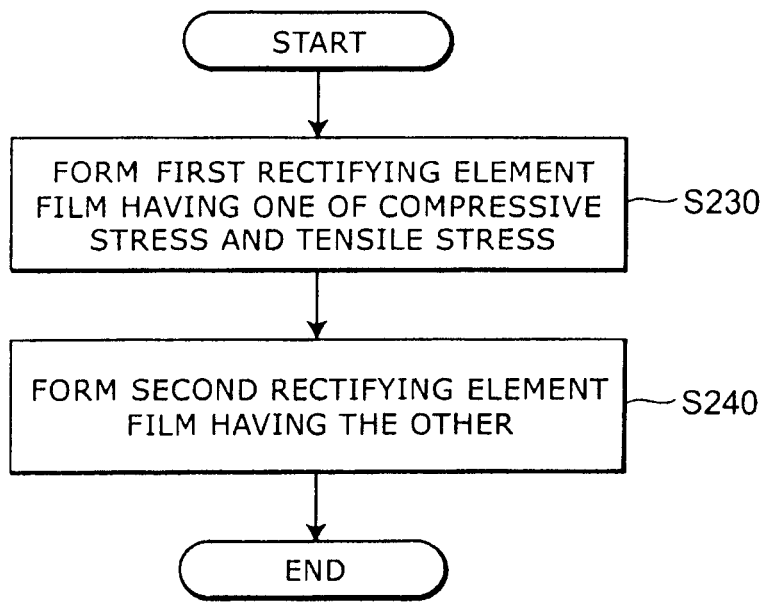
FIG. 16 is a flow chart illustrating a method for manufacturing a nonvolatile memory device according to a fourth embodiment of the present invention.

FIG. 16 is a flow chart illustrating the method for manufacturing a nonvolatile memory device according to the fourth embodiment of the present invention.

As shown in FIG. 16, in the method for manufacturing a nonvolatile memory device according to the fourth embodiment of the present invention, first, the first rectifying element film that generates one of the compressive stress and the tensile stress is formed, which forms a part of the rectifying element 70 (step S230). As described previously, a $p^+$-type p-Si film which generates the compressive stress is film-formed as the first rectifying element film (the first semiconductor layer 71), for example.

Then, the second rectifying element film that generates the other of the stresses is formed, which forms another part of the rectifying element 70 (step S240). For example, an $n^+$-type a-Si film which generates a tensile stress is film-formed as the second rectifying element film (the second semiconductor layer 72).

After that, step S230 and step S240, including steps for patterning the first rectifying element film and the second rectifying element film, are repeated until the number of element memory layers 66 reaches a prescribed number. This compensates the stresses of the first rectifying element film and the second rectifying element film and reduces the warpage.

Thus, the method for manufacturing a nonvolatile memory device according to this embodiment can provide a nonvolatile memory device in which the warpage of the substrate is small even in a configuration including a large number of element memory layers 66 stacked therein. In the aforementioned, the order of step S230 and step S240 is optional.

The first rectifying element film and the second rectifying element film may be patterned together with the recording layer 60. Further, the first rectifying element film and the second rectifying element film may be patterned together with any of the first wiring 50 and the second wiring 80. Hereinafter, an example will be described.

Figure 17:
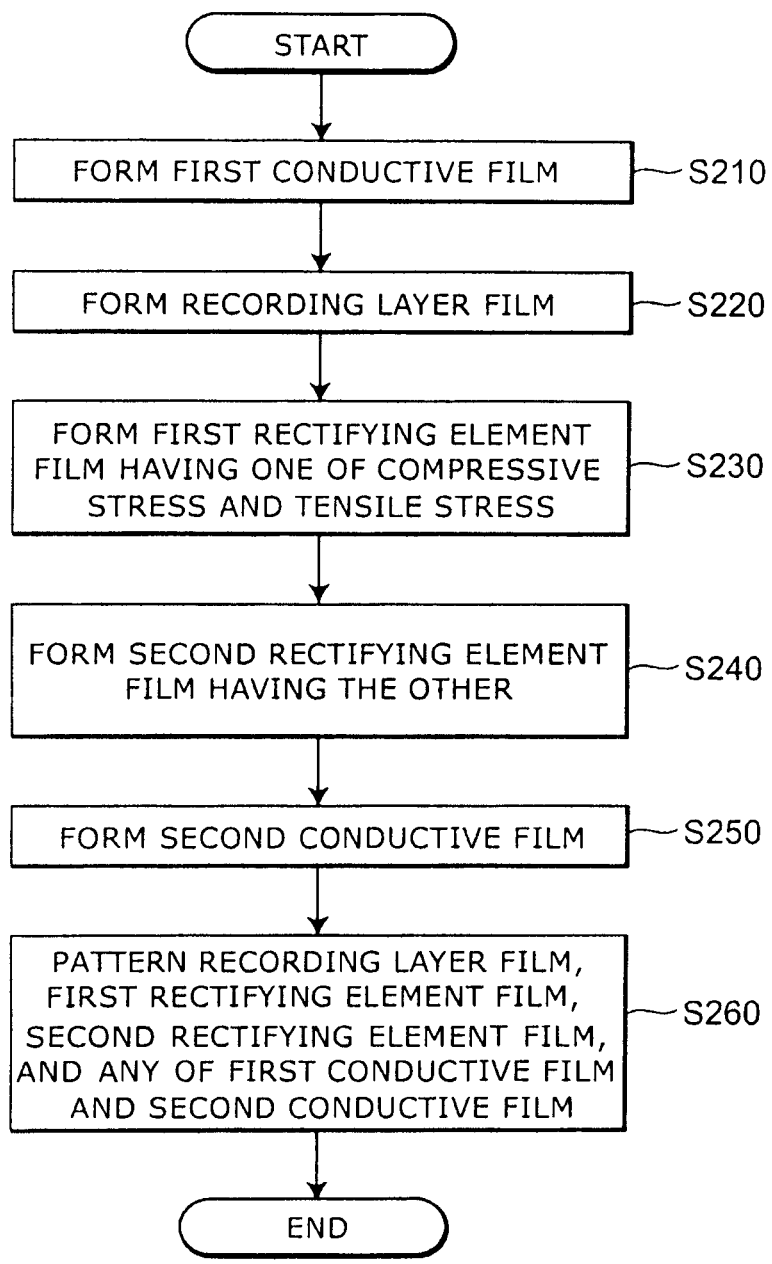
FIG. 17 is a flow chart illustrating another method for manufacturing a nonvolatile memory device according to the fourth embodiment of the present invention.

FIG. 17 is a flow chart illustrating another method for manufacturing a nonvolatile memory device according to the fourth embodiment of the present invention.

As shown in FIG. 17, in the method for manufacturing a nonvolatile memory device according to the fourth embodiment of the present invention, first, a first conductive film which forms the first wiring 50 is formed on a semiconductor substrate (step S210).

Then, a recording layer film which forms the recording layer 60 is formed (step S220).

Then, the first rectifying element film that generates one of the compressive stress and the tensile stress is formed, which constitutes a part of the rectifying element 70 (step S230). For example, a $p^+$-type p-Si film which generates a compressive stress is film-formed as the first rectifying element film (the first semiconductor layer 71).

Then, the second rectifying element film that generates the other of the stresses is formed, which constitutes another part of the rectifying element 70 (step S240). For example, an $n^+$-type a-Si film which generates a tensile stress is film-formed as the second rectifying element film (the second semiconductor layer 72).

Then, a second conductive film which forms the second wiring 80 is formed (step S250).

Then, the recording layer film, the first rectifying element film, the second rectifying element film, and any of the first conductive film and the second conductive film, all mentioned above, are patterned (step S260).

After that, steps S210 to S260 mentioned above are repeated.

That is, the method for manufacturing a nonvolatile memory device according to the fourth embodiment of the present invention is for manufacturing a nonvolatile memory device in which a plurality of element memory layers are stacked. Each element memory layer includes: a first wiring; a second wiring provided nonparallel to the first wiring; a stacked structure body provided between the first wiring and the second wiring and including a recording layer and a rectifying element. The method includes: forming a first conductive film which forms the first wiring on a semiconductor substrate; forming a recording layer film which forms the recording layer; forming a first rectifying element film which forms a part of the rectifying element and includes one of the compressive stress and the tensile stress; forming a second rectifying element film which forms another part of the rectifying element and generates the other of the stresses; forming a second conductive film which forms the second wiring; and patterning the recording layer film, the first rectifying element film, the second rectifying element film, and any of the first conductive film and the second conductive film.

In the aforementioned, step S220, step S230, and step S240, for example, may be performed as a step for forming another element memory layer 66 between step S250 and step S260.

This compensates the stresses of the first rectifying element film and the second rectifying element film and reduces the warpage. Thus, the method for manufacturing a nonvolatile memory device according to this embodiment can provide a nonvolatile memory device in which the warpage of the substrate is small even in a configuration including a large number of element memory layers 66 stacked therein. In the aforementioned, the order of step S220, and step S230 and step S240 is optional. The order may vary with different element memory layers 66.

Thus, in this method, a plurality of first films and a plurality of second films are formed on a substrate stacking alternately. At least one of the plurality of the first films generates one of a compressive stress and a tensile stress. At least one of the plurality of the second films generates the other of the compressive stress and the tensile stress. Each of the second films is conductive. And, a memory unit opposed to at least one of the plurality of the second films is formed. Further, the plurality of the first films include a semiconductor film of a first conductivity type and the plurality of the second films include a semiconductor film of a second conductivity type. Then, between stacked layers having the first film and the second film, at least one of a first wiring 50 and a second wiring 50 which is nonparallel to the first wiring 50 are formed. The memory unit is formed between the first wiring 50 and the second wiring 80.

Hereinabove, embodiments of the present invention are described with reference to specific examples. However, the present invention is not limited to these examples. For example, those skilled in the art may appropriately select specific configurations of components of the nonvolatile memory device and the method for manufacturing the same from known art and similarly practice the present invention; and such practice is included in the scope of the present invention to the extent that similar effects thereto are obtained.

Further, any two or more components of the specific examples may be combined within the extent of technical feasibility. Such combination is included in the scope of the present invention to the extent that the spirit of the present invention is included.

Moreover, all nonvolatile memory devices and methods for manufacturing the same that can be obtained by an appropriate design modification by those skilled in the art based on the nonvolatile memory device and the method for manufacturing the same described above as embodiments of the present invention also are within the scope of the present invention to the extent that the spirit of the present invention is included.

Furthermore, those skilled in the art may arrive at various alterations and modifications within the idea of the present invention. Such alterations and modifications should be seen as within the scope of the present invention.

The invention claimed is:

1. A nonvolatile memory device comprising a plurality of element memory layers stacked on each other,
    each of the plurality of the element memory layers including:
        a first wiring;
        a second wiring provided nonparallel to the first wiring; and
        a stacked structure body provided between the first wiring and the second wiring and including a memory unit and a rectifying element, the rectifying element including:
            a first rectifying element film generating one of a compressive stress or a tensile stress;
            a second rectifying element film generating the other of the compressive stress or the tensile stress; and
            an intrinsic semiconductor film provided between the first rectifying element film and the second rectifying element film.

2. The device according to claim 1, wherein the first rectifying element film includes a semiconductor film of a first conductivity type and the second rectifying element film includes a semiconductor film of a second conductivity type.

3. The device according to claim 1, wherein the memory unit includes one of a resistance-change film and a phase-change film, a resistance in the resistance-change film changes on the basis of a voltage applied to the resistance-change film, and a resistance in the phase-change film changes on the basis of Joule heat generated by a voltage applied to the phase-change film.

4. A nonvolatile memory device comprising:
    a plurality of element memory layers stacked on each other,
    each of the plurality of the element memory layers including:
        a first wiring;
        a second wiring provided nonparallel to the first wiring; and
        a stacked structure body provided between the first wiring and the second wiring and including a memory unit and a rectifying element, the rectifying element including:
            a first rectifying element film generating one of a compressive stress or a tensile stress, the first rectifying element including a semiconductor film of a first conductivity type, the semiconductor film of the first conductivity type including one of a polycrystalline silicon film or an amorphous silicon film; and
            a second rectifying element film generating the other of the compressive stress or the tensile stress, the second rectifying element film including a semiconductor film of a second conductivity type, the semiconductor film of the second conductivity type including the other of the polycrystalline silicon film or the amorphous silicon.

5. The device according to claim 4, wherein the memory unit includes one of a resistance-change film or a phase-change film, a resistance in the resistance-change film changes on the basis of a voltage applied to the resistance-change film, and a resistance in the phase-change film changes on the basis of Joule heat generated by a voltage applied to the phase-change film.

* * * * *